US005604775A

United States Patent [19]
Saitoh et al.

[11] Patent Number: 5,604,775
[45] Date of Patent: Feb. 18, 1997

[54] DIGITAL PHASE LOCKED LOOP HAVING COARSE AND FINE STEPSIZE VARIABLE DELAY LINES

[75] Inventors: Tetsuo Saitoh; Syuji Matsuo; Itsurou Taniyoshi; Koichi Kitamura, all of Kanagawa, Japan

[73] Assignee: NEC Corporation, Japan

[21] Appl. No.: 536,989

[22] Filed: Sep. 29, 1995

[30] Foreign Application Priority Data

Sep. 29, 1994 [JP] Japan .................................. 6-235157

[51] Int. Cl.⁶ ...................................................... H03D 3/24
[52] U.S. Cl. .............................................. 375/376; 331/25
[58] Field of Search ........................................ 375/373, 374, 375/376; 327/147, 149, 156, 158; 348/536, 537; 331/25

[56] References Cited

U.S. PATENT DOCUMENTS

| | | |
|---|---|---|
| 4,912,433 | 3/1990 | Motegi et al. . |
| 5,079,519 | 1/1992 | Ashby et al. . |
| 5,109,394 | 4/1992 | Hjerpe et al. ............................ 375/376 |
| 5,341,110 | 8/1994 | Nardi . |
| 5,347,234 | 9/1994 | Gersbach et al. . |

FOREIGN PATENT DOCUMENTS

| | | |
|---|---|---|
| 0299724 | 1/1989 | European Pat. Off. . |
| 2197553 | 5/1988 | Great Britain . |

*Primary Examiner*—Stephen Chin
*Assistant Examiner*—Kevim Kim
*Attorney, Agent, or Firm*—Ostrolenk, Faber, Gerb & Soffen, LLP

[57] ABSTRACT

In a digital phase locked loop, a coarse stepsize variable delay line and a fine stepsize variable delay line are connected in series for receiving a reference clock pulse and imparting thereto variable delays in accordance with higher significant bits and lower significant bits. The delayed clock pulse is delivered to the input of a clock tree through which the clock pulse propagates and are supplied to various parts of an integrated circuit chip. A phase detector provides a phase comparison between the reference clock pulse and a delayed clock pulse appearing at one of the outputs of the clock tree. A delay controller counts the reference clock pulse to produce a count value, and increments or decrements the count value in accordance with the output of the phase detector. The up-down count value is supplied as the higher and lower significant bits to the coarse and fine stepsize variable delay lines at such longer intervals than the intervals at which the reference clock pulse occurs, so that the delayed clock pulse is allowed a sufficient time to propagate through the clock tree.

12 Claims, 15 Drawing Sheets

PHASE COMPARATOR 30

FINE STEPSIZE DELAY LINE 12

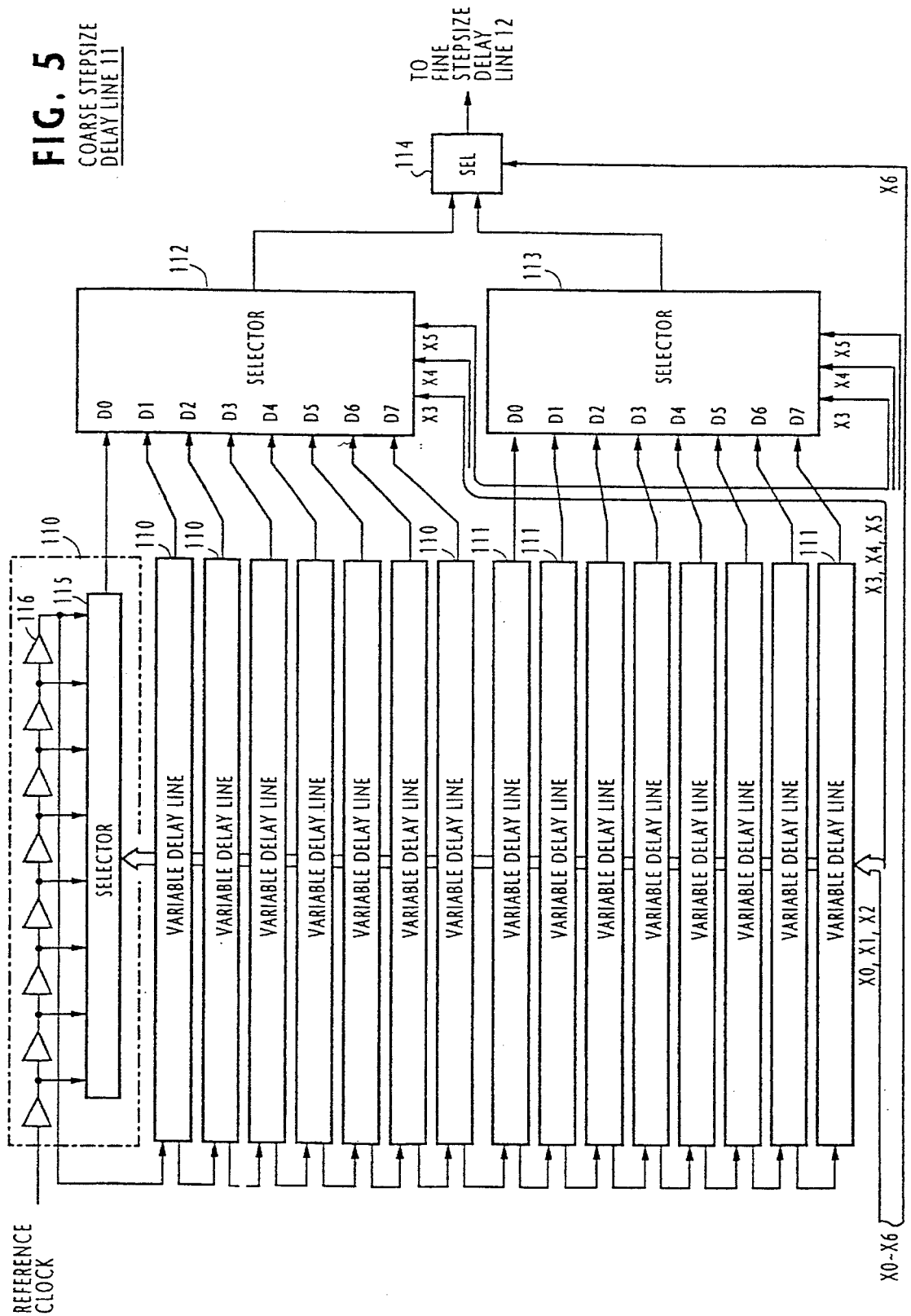

SEQUENCE CONTROLLER 41

FIG. 9  SEQUENCE CONTROLLER 41

U/D COUNTER 42

COUNTER 460

COUNTER 461

COUNTER 462

U/D COUNTER 42A

COUNTER 460A

DIGITAL PHASE LOCKED LOOP HAVING COARSE AND FINE STEPSIZE VARIABLE DELAY LINES

BACKGROUND OF THE INVENTION

1. Field of the Invention

The present invention relates to a digital phase locked loop for use with integrated circuits such as ASIC (application specific integrated circuits) chips.

2. Description of the Related Art

In a prior art digital phase locked loop, the reference clock pulse is delayed by a variable delay line in the amount corresponding to the output of an up-down counter, which counts the reference clock. The delayed clock is fed into a clock tree where it propagates through different paths to the outputs of the clock tree and is applied to the various parts of an LSI chip. One of the outputs of the clock tree is applied to a phase detector where it is compared with the reference clock. The output of the phase detector is applied as an up/down command input to the up-down counter, which, in response, increments or decrements its count value. However, the prior art PLL suffers from jitter produced as a result of the variation of delays introduced to the reference clock. Additionally, if the magnitude of jitter is restrained to within limited bounds, the upper limit of the lock range of the PLL would be constrained by the delay time of the clock tree.

SUMMARY OF THE INVENTION

It is therefore an object of the present invention to provide a digital phase locked loop having reduced jitter.

According to the present invention, there is provided a digital phase locked loop for use with a clock tree having an input and a plurality of clock propagation paths extending from the input to a plurality of outputs. The digital phase locked loop comprises a coarse stepsize variable delay line and a fine stepsize variable delay line connected in series for receiving a reference clock pulse and imparting thereto variable delays in accordance with higher significant bits applied to the coarse stepsize delay line and in accordance with lower significant bits applied to the fine stepsize delay line, and delivering the delayed clock pulse to the input of the clock tree. A phase detector provides phase comparison to determine the phase difference between the reference clock pulse and a delayed clock pulse appearing at one of the outputs of the clock tree. A delay controller is provided, which counts the reference clock pulse to produce a count value. The controller increments or decrements the count value in accordance with the output of the phase detector and supplies the count value as the higher and lower significant bits to the coarse and fine stepsize variable delay lines at such longer intervals than the intervals at which the reference clock pulse occurs, so that the delayed clock pulse is allowed a sufficient time to propagate through the clock tree.

In the delay controller, a first timing counter is provided for counting the reference clock pulse to produce a count and producing a first timing pulse when the count repeatedly reaches a predetermined value, the first timing pulse defining the start timing of each of the longer intervals. A sequence controller is responsive to a first occurrence of the first timing pulse for producing a first enable pulse when the output of the phase detector has a first logic level, and responsive to a repeated occurrence of the first timing pulse for producing a second enable pulse when the output of the phase detector has changed to a second logic level. An up-down counter is arranged to be enabled in response to the first and second enable pulses for counting the reference clock pulse to produce a count value, incrementing or decrementing the count value in accordance with a phase comparison provided by the phase detector, and producing from the count value a first group of delay control bits in response to the first enable pulse, and a second group of delay control bits and a third group of delay control bits in response to the second enable pulse. A second timing counter is responsive to each occurrence of the first timing pulse for counting a delayed clock pulse from the coarse stepsize delay line to produce a count, and producing a second timing pulse when the count reaches a predetermined value. The second timing pulse defines the end timing of each of the longer intervals. In response to the second timing pulse, the first and second groups of delay control bits are stored in a latch and forwarded to the coarse stepsize delay line as the higher significant bits and the third group of control bits are stored in the latch and forwarded to the fine stepsize delay line as the lower significant bits.

BRIEF DESCRIPTION OF THE DRAWINGS

The present invention will be described in further detail with reference to the accompanying drawings, in which:

FIG. 5 is a block diagram illustrating details of the coarse stepsize delay line of FIG. 3;

DETAILED DESCRIPTION

Figure 1:
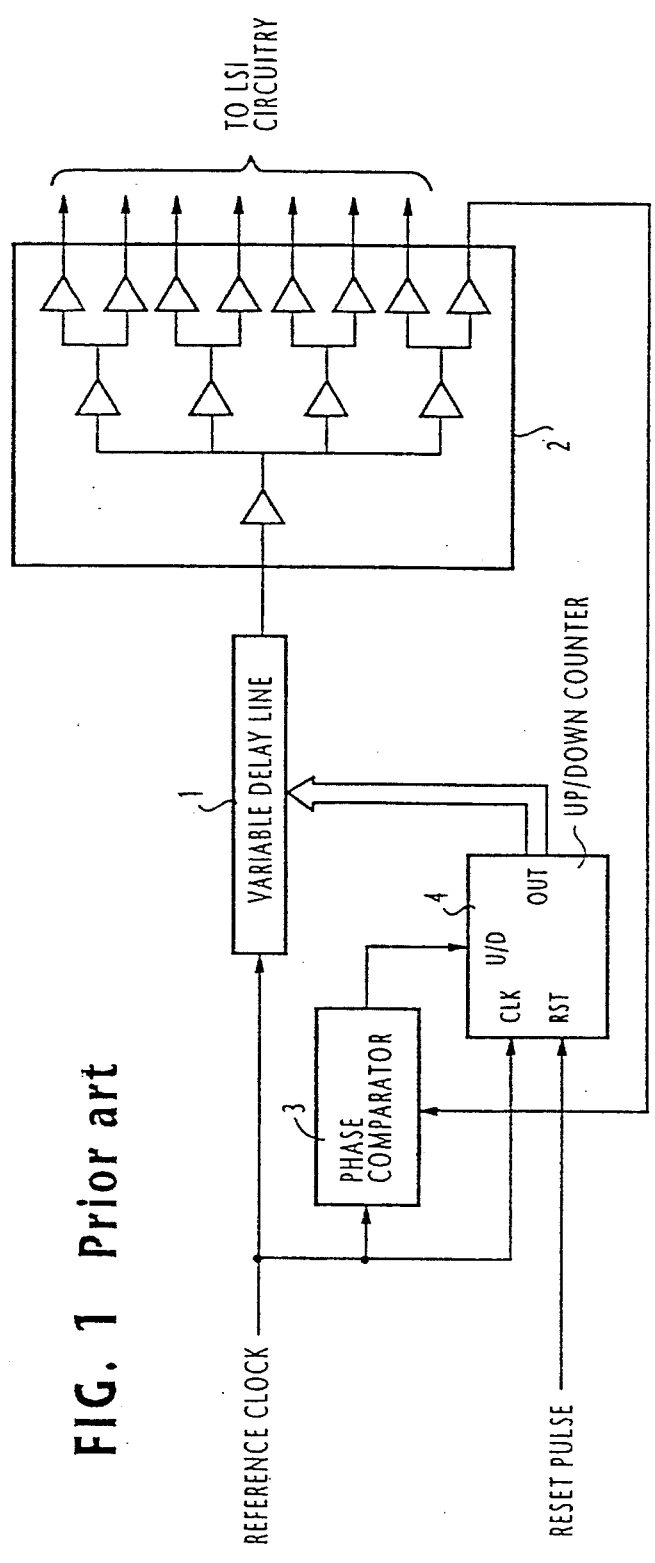
FIG. 1 is a block diagram of a prior art digital phase locked loop.
Figure 2B:
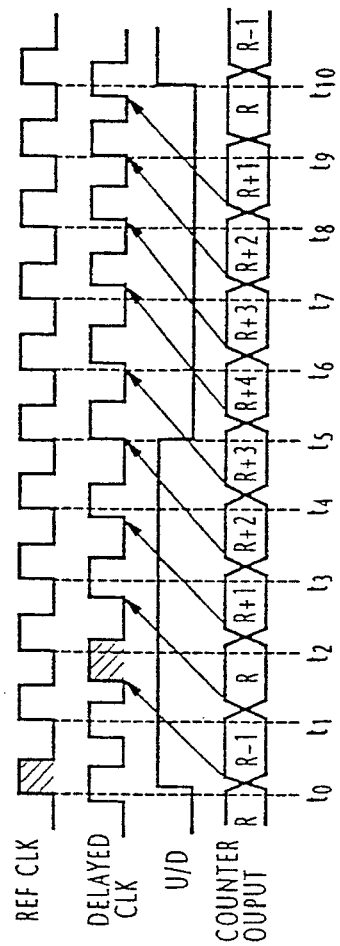
FIGS. 2A and 2B are timing diagrams associated with the prior art phase locked loop of FIG. 1.
Figure 2A:
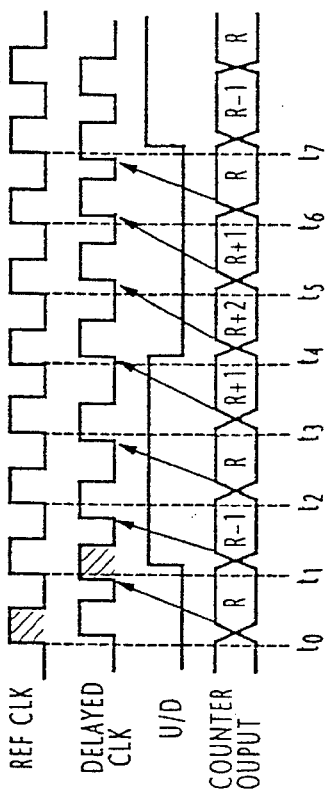

Before proceeding with the detailed description of the present invention, it may prove helpful to provide an explanation of a prior art digital phase lock loop ("PPL") with reference to FIGS. 1, 2A and 2B.

The prior art digital PLL includes a variable delay line 1 by which a reference clock pulse is delayed in the amount corresponding to the output of an up-down counter 4. The delayed clock is fed into a clock tree 2 where it propagates through different paths formed by a plurality of buffer amplifiers connected in tree form, so that clock pulses of the same phase appear at the outputs of the clock tree for application to the various components of an LSI chip such as application specific integrated circuits (ASIC) chip, not shown. One of the outputs of the clock tree 2 is applied to a phase detector 3, which comprises a single D-type flip-flop for phase comparison with the reference clock. The output of the phase detector 3 is applied to the up/down command input of the up-down counter 4, which counts the reference clock pulse to increment or decrement its count output depending on the logic level of the phase detector output to attain phase synchronization between the reference and delayed clock pulses.

If the amount of phase difference between the reference and delayed clock is smaller than one clock interval, as shown in FIG. 2A, the up-down counter 4 decrements its output R at times $t_1$, $t_5$ and $t_6$ and increments it at times $t_2$, $t_3$ and $t_4$, and this pattern of variation is repeated. This results in what is known as "jitter" and the magnitude of jitter is defined as the difference between a maximum phase advance and a maximum phase lag of the delayed clock with respect to the reference clock. In the case of FIG. 2A, the maximum phase advance and the maximum phase lag correspond respectively to R+2 and R−1 and the magnitude of jitter is determined by {(R+2)−(R−1)} multiplied by the unit delay time of the variable delay line 1, i.e., three times the unit delay time.

If the phase difference exceeds one clock interval, as shown in FIG. 2B, the up-down counter 4 increments its output at times $t_1$ through $t_5$ and decrements it at times $t_6$ through $t_{10}$, and this pattern of variation is repeated. In this case, the magnitude of jitter is determined by {(R+4)−(R−1)} multiplied by the unit delay time of the variable delay line 1, i.e., five times the unit delay time. If the clock interval is represented by T and the total delay time of the clock by $D_T$, the amount of delay allowed for the clock tree is smaller than $T-D_T$.

Being determined by the variation of delays introduced to the reference clock, the jitter of the prior art PLL is of substantial magnitude. If an attempt is made to constrain the magnitude of jitter to within limited bounds, the upper limit of the lock range of the PLL would be constrained by the delay time of the clock tree.

Figure 3:
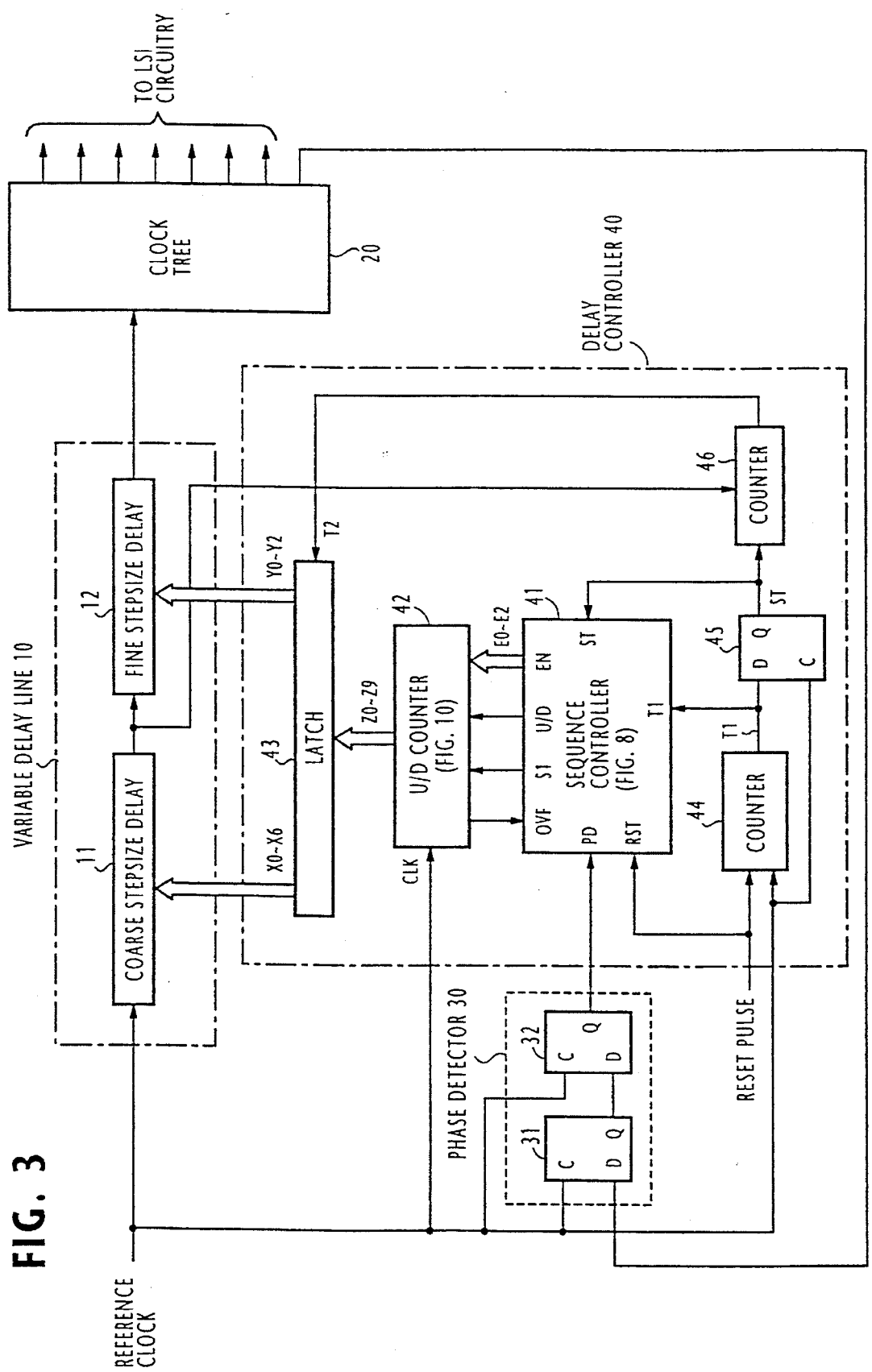
FIG. 3 is a block diagram :of a digital phase locked loop according to the present invention.

Referring now to FIG. 3, a digital phase-locked loop according to the present invention is illustrated. As illustrated, it comprises a variable delay line 10, a clock tree 20, a phase comparator 30 and a delay controller 40. Variable delay line 10 consists of a coarse stepsize delay line 11 and a fine stepsize delay line 12 connected in cascade between the reference clock source, not shown, and the input of the clock tree 20. The coarse stepsize delay line 11 is controlled by seven control bits X0–X6 and the fine stepsize delay line 12 is controlled by three control bits Y0–Y2.

Figure 4:
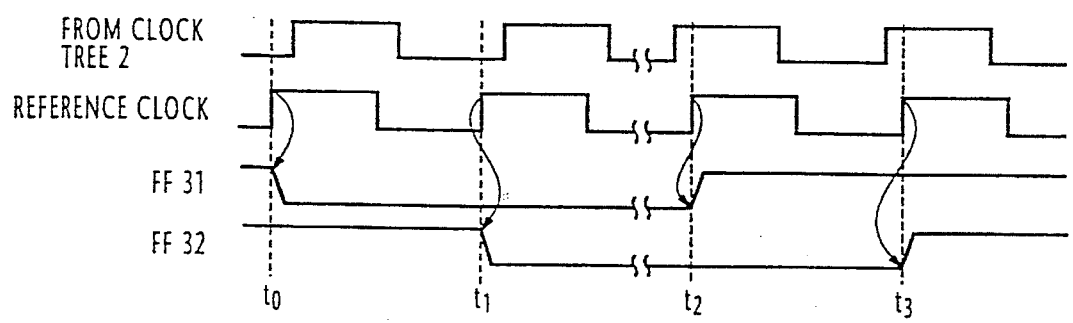
FIG. 4 is a timing diagrams associated with the phase detector of FIG. 3.

The phase detector 30 comprises D-type flip-flops 31 and 32 each having the clock input connected to respond to the reference clock pulse. The data input of flip-flop 31 is connected to one of the outputs of clock tree 20 and the data input of flip-flop 32 is connected to the Q output of flip-flop 31 to produce a phase-detector output PD. If the phase of the reference clock is advanced with respect to the clock pulses from the clock tree 20 at times $t_0$ and $t_2$ as shown in FIG. 4, flip-flop 31 switches to low output state in response to the leading edge of the first reference clock at time $t_0$ and flip-flop 32 goes low in response to the leading edge of the next reference clock at time $t_1$. If the phase of the reference clock lags behind the clock tree output at times $t_2$ and $t_3$, flip-flop 31 goes high in response to the leading edge of the reference clock at time $t_2$ and flip-flop 32 goes high in response to the leading edge of the reference clock at time $t_3$. It is seen that the output pulse PD of phase comparator 30 changes state one clock interval after an advance-lag phase transition that occurs in the clock tree output with respect to the reference clock.

Delay controller 40 includes a sequence controller 41, an up-down counter 42 for counting the reference clock, a latch 43 connected thereto for latching delay control bits X and Y, a first timing counter 44 for producing a first timing pulse T1 for defining the start timing of a period during which clock pulses are allowed to propagate through the clock tree 20, a D-type flip-flop 45 for producing a sequence start pulse ST, and a second timing counter 46 for producing a second timing pulse T2 for defining the end timing of the period and updating the X/Y values in the latch 43.

The first timing counter 44 is a 3-bit counter which is initialized in response to either a reset pulse RST for counting the reference clock pulse and includes a decoding logic to produce a timing pulse T1 when it counts a seventh clock pulse for every eight-clock interval. The output of counter 44 is supplied to the data input of flip-flop 45 as well as to the sequence controller 41. D-type flip-flop 45 produces a sequence start pulse ST in response to the leading edge of a reference clock pulse and supplies the pulse ST to the second timing counter 46 and sequence controller 41. The second timing counter 46 is enabled by the pulse ST to count the output of the coarse stepsize delay line 11 and produces a second timing pulse T2 when it counts two clock pulses. The second timing pulse T2 is applied to the latch 43 to update control bits X0–X6 and Y0–Y2 with new control bits Z0–Z9 supplied from the up-down counter 42. Up-down counter 42 also produces the overflow pulse OVF when it is overflowed with reference clock pulses.

Sequence controller 41 receives the pulses RST, PD, T1, ST and OVF to produce a sequence pulse S1 (which will be used as a reset pulse), an up-down control pulse U/D and enable pulses EN0–EN2. Using these output pulses, the sequence controller 41 controls the up-down counter 42.

As shown in FIG. 5, the coarse stepsize delay line 11 comprises a first group of variable delay lines 110 and a second group of variable delay lines 111, and selectors 112 and 113 associated respectively with the variable delay lines of the first and second groups. All variable delay lines are of identical construction, each comprising a tapped-delay line formed by a series of eight unit delay elements 115, and a selector 116. The lower significant bits X0, X1 and X2 of coarse delay control bits X0–X6 are simultaneously supplied to the selectors 116 of all variable delay lines 110 and 111 to select one of the eight successive taps of each delay line for coupling to a corresponding one of eight input terminals D0 to D7 of the associated selectors 112 and 113. The end of the tapped-delay lines of each variable delay line is connected to the input of the next variable delay line except for the last variable delay line whose output is connected to the input terminal D7 of selector 113, so that a maximum of 128 delay-line taps are connected in series between the reference clock source and the D7 input of selector 113. On the other hand, the higher significant bits X3, X4 and X5 of the coarse control bits X0–X6 are supplied to selectors 112 and 113 to selectively connect one of their input terminals to a two-position selector 114 where one of the outputs of selectors 112 and 113 is selected by the most significant bit X6 for coupling to the fine stepsize delay line 12. By using the 7-bit control data X0–X6, any one of the 128 delay-line taps can be selectively connected to the input of the fine stepsize delay line 12.

Each delay-line element 115 has a unit delay time $D_1$ which represents the minimum stepsize of the coarse stepsize delay line 11. With a total of 128 delay-line elements, the difference DV between the minimum of delay ($=D_1$) and the maximum of delay ($=D_1 \times 128$) is $DV = D_1 \times 127$ which corresponds to the lowest frequency of the lock range of the PLL.

Figure 6:
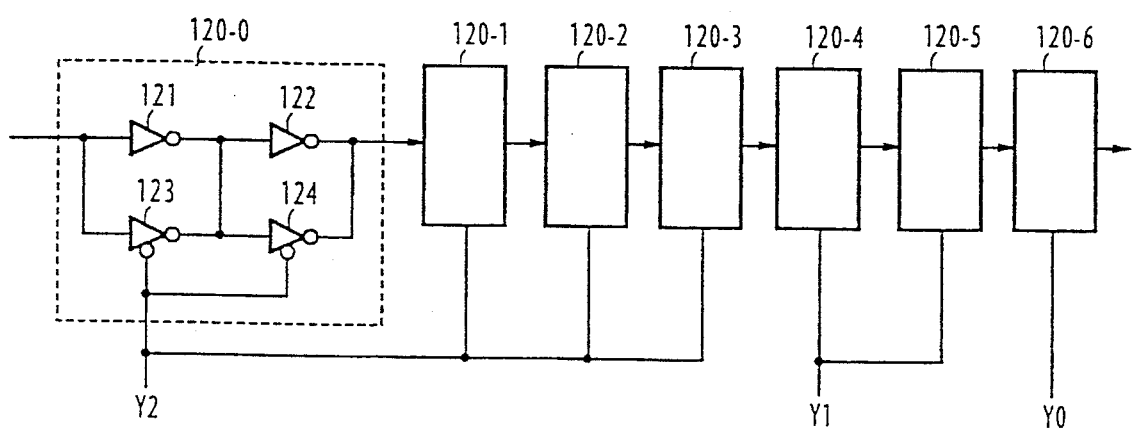
FIG. 6 is a block diagram illustrating details of the fine stepsize delay line of FIG. 3.

As illustrated in FIG. 6, the fine stepsize delay line 12 is constructed of a series of seven delay-line units 120-0 to 120-6 of identical structure. Each delay-line unit 120 has a first series circuit of inverters 121 and 122 and a second series circuit of clocked inverters 123 and 124, with the first and second series circuits being connected in parallel with their respective circuit junctions being connected together. The clocked inverters 123, 124 have their control inputs connected together to receive a corresponding delay control bit Y. Specifically, the most significant control bit Y2 is supplied to delay-line elements 120-0 to 120-3, the control bit Y1 to delay-line elements 120-4 and 120-5, and the least significant bit Y0 to delay-line element 120-6.

When the control bit Y applied to a given delay-line element is 0, the clocked inverters 123, 124 are in a conductive state, resulting in the given delay-line element having a small delay time. When the control bit Y is 1, they are switched to a nonconductive state, resulting in the delay-line element having a larger delay time. When all three Y bits are zero, the fine stepsize delay line 12 provides a minimum delay time represented by $D_0$. Therefore, the delay line 12 can vary in delay time between the minimum of $D_0$ and the maximum of $D_0 + D_2 \times 7$, where $D_2$ is the delay time of each element 120, i.e., the minimum stepsize of the fine stepsize delay line 12.

The operations of the delay controller 40 and sequence controller 41 will be briefly described with reference to FIGS. 7A and 7B, respectively.

Figure 7A:
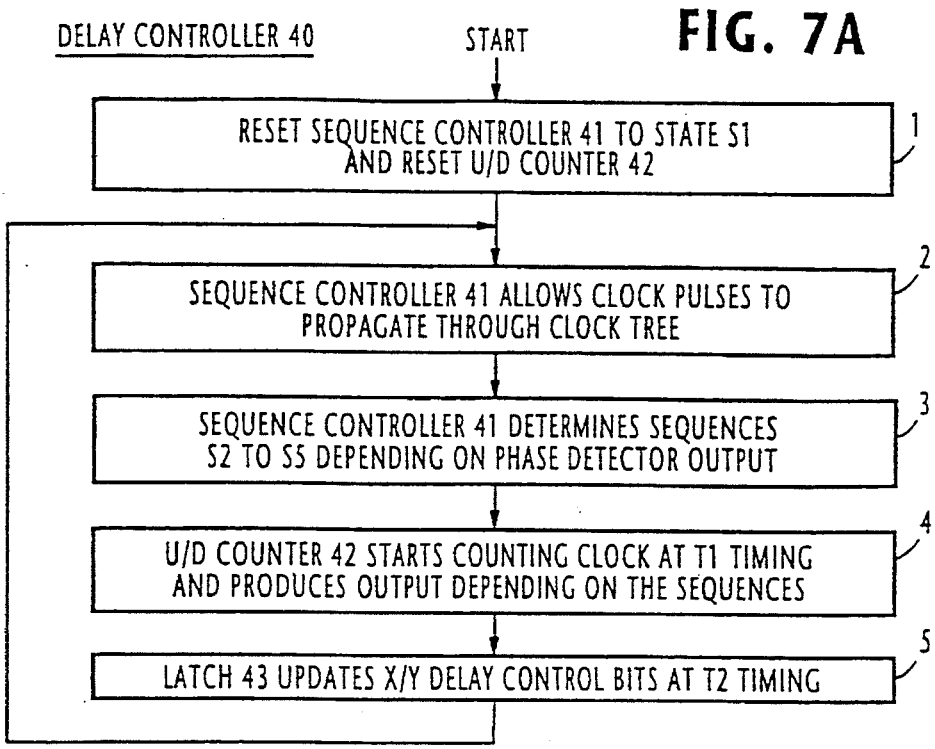
FIG. 7A is a flowchart for describing the overall operation of the inventive PLL.

In FIG. 7A, the operation of the delay controller 40 begins with step 1 where a reset pulse is applied to the sequence controller 41 which, in response, initializes its internal state and produces a sequence pulse S1 to reset the up-down counter 42 to an initial state. In step 2, the sequence controller 41 allows clock pulses to propagate through the clock tree. In step 3, the sequence controller 41 determines sequences S2 to S5, depending on the logic level of the PD output of phase detector 30 that varies with time. The sequence controller further responds to the presence of an output OVF from up-down counter 42 for returning to the initializing step 1. In step 4, the sequence controller 41 checks the output of the first timing counter 44 for the first timing pulse T1 and starts operating the up-down counter 42 when the first timing pulse T1 is generated and produces an output in accordance with the sequence determined by step 3. In step 5, a second timing pulse T2 is generated and the latch 43 updates the X/Y control bits with new values from the up-down counter. Following step 5, the delay controller 40 returns to step 2 to allow the delayed clock to propagate through the clock tree 20 and repeats the process.

Figure 7B:
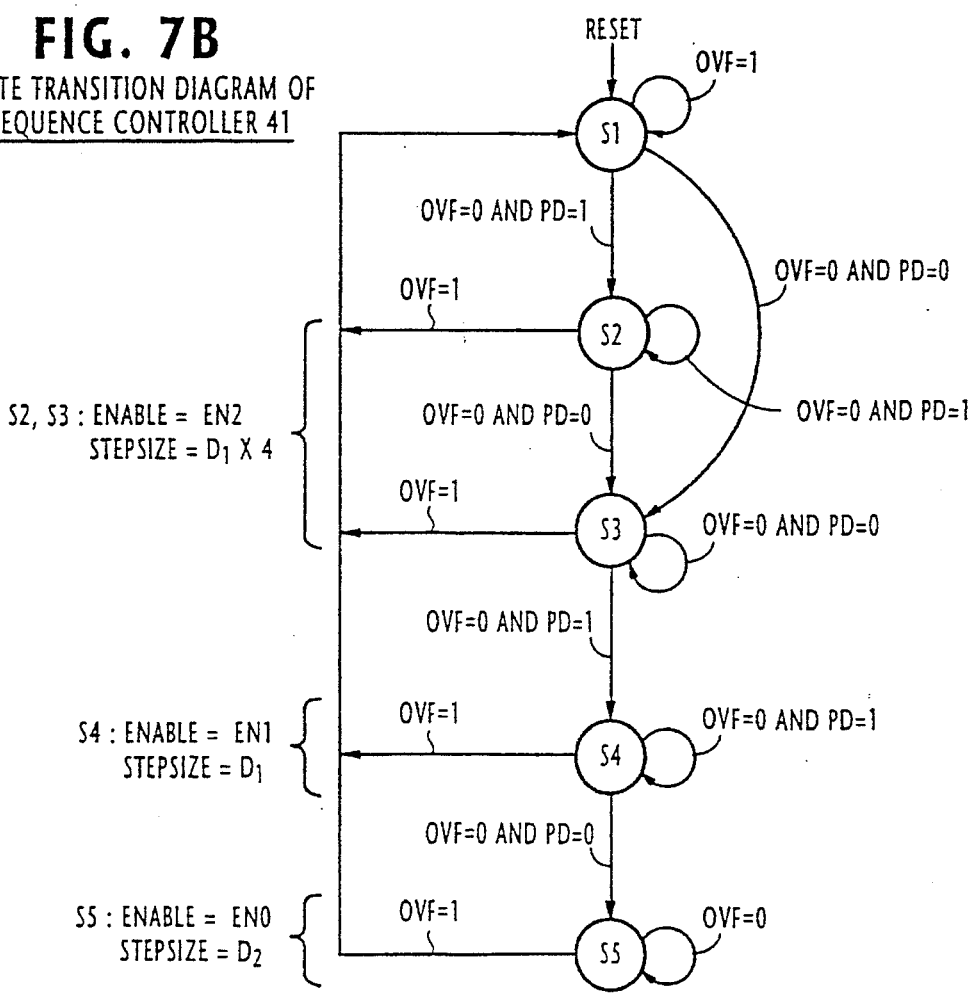
FIG. 7B is a state transition diagram of the sequence controller of FIG. 3.

In FIG. 7B, the sequence controller 41 enters the state of a first sequence S1 when it is reset by pulse RST. If an overflow condition exists in the up-down counter 42, the sequence controller 41 remains in the sequence S1. If no overflow condition exists, the sequence controllers exits the sequence S1 and enters a sequence S2 if the phase detector output PD is "1", or enters a sequence S3 if the PD output is "0". As long as the conditions OVF=0 and PD=1 continue, the sequence controller remains in sequence S2 and as long as OVF=0 and PD=0 prevail, it remains in sequence S3. Transition from sequence S3 to sequence S4 occurs when the PD value becomes equal to "1" and the sequence controller remains in state S4 as long as OVF=0 and PD=1. Sequence S5 is entered when the PD value changes from "1" to "0" and this sequence continues as long as OVF=0, regardless of the PD value. In any of states S2 to S5, the sequence controller returns to the reset state S1 if the OVF value changes to "1".

As will be described in detail, the sequence controller 41 produces enable pulses EN2, EN1 and EN0 depending on the sequence in which it is in and produces its outputs that drive the variable delay line 10 with different stepsizes. During sequences S2 and S3, the sequence controller produces the enable pulse EN2 and its outputs define a maximum stepsize equal to $D_1 \times 4$, where $D_1$ is the unit delay time of the coarse stepsize delay line 11. During sequence S4, the sequence controller produces the enable pulse EN1 and its outputs define a medium stepsize $D_1$. During sequence S5, it produces the enable pulse EN0 and defines a minimum stepsize $D_2$ which is equal to the unit stepsize of the fine stepsize delay line 12.

For operating the up-down counter 42 in different enable states, the sequence controller 41 generates enable pulses EN2, EN1 and EN0 depending on the determined sequence. Specifically, sequence states S2 and S3 correspond to enable pulse EN2, and states S4 and S5 correspond respectively to enable pulses EN1 and EN0.

Figure 8:
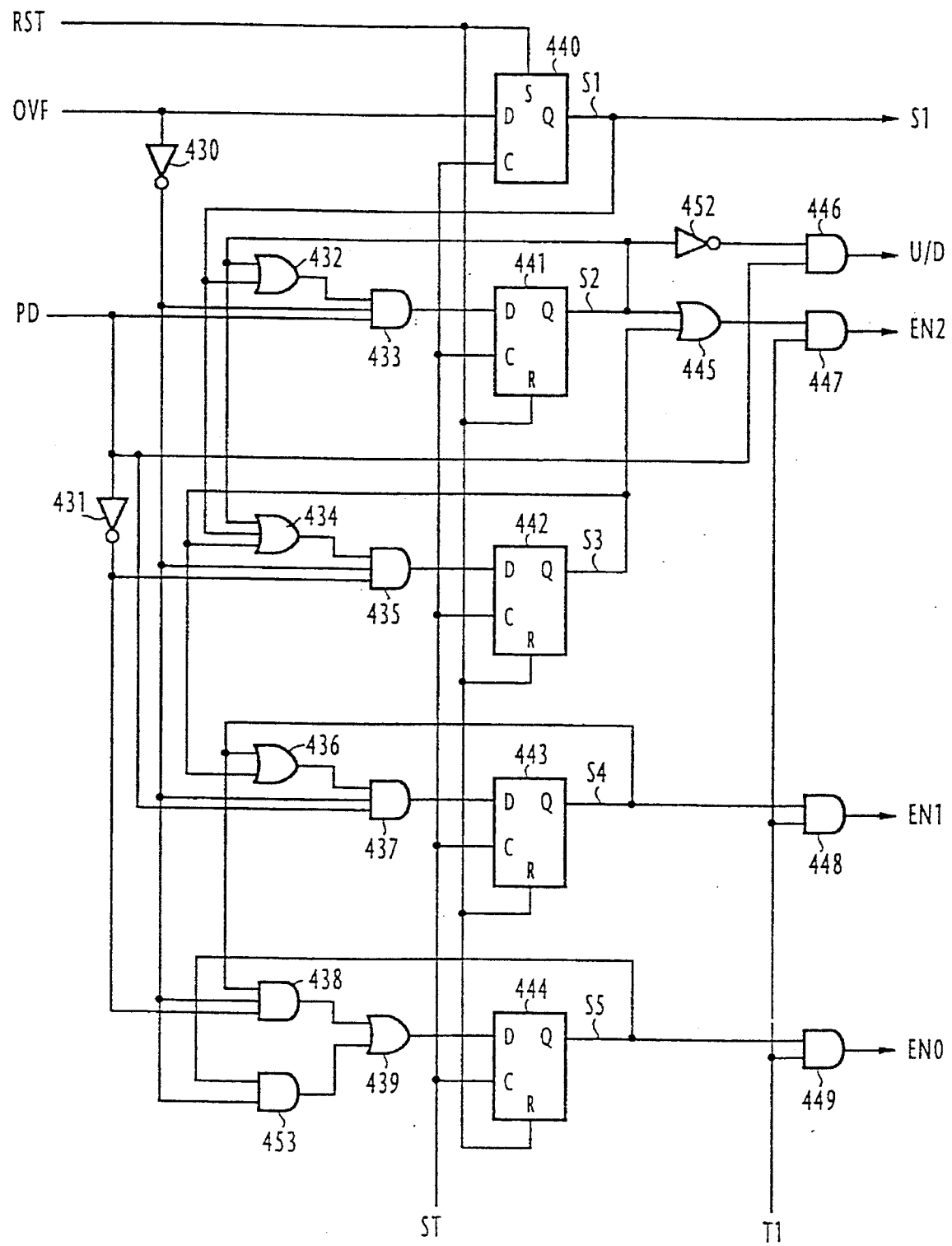
FIG. 8 is a block diagram illustrating details of the sequence controller.

Details of the sequence controller 41 are shown in FIG. 8. Sequence controller 41 comprises D-type flip-flops 440 to 444 corresponding respectively to sequences S1 to S5. Each D-type flip-flop receives the start timing pulse ST from the flip-flop 45 of FIG. 3 at the clock input C. Flip-flop 440 has a set input S and all the other flip-flops have a reset input R, these S and R input terminals being connected together to receive the reset pulse RST. Thus, in response to the reset pulse, flip-flop 440 is set to a 1 state, producing a pulse S1 for defining the first sequence, while all the other flip-flops are reset to a 0 state.

The S1 output of flip-flop 440 is applied to the up-down counter 42 and AND gates 433, 435 via OR gates 432, 434 to enable the AND gates 433, 435. The overflow pulse OVF from the up-down counter is applied to the data input of flip-flop 440. Thus, the S1 output of flip-flop 440 changes to "0" in response to a start timing pulse ST if the logic state of reset terminal RST goes low and changes to "1" in response to a pulse ST in the presence of OVF=1.

Flip-flop 441 produces a pulse S2 for defining the second sequence when the output of AND gate 433 is "1", which occurs if OVF=0 and PD=1 in the presence of S1=1. To maintain the sequence controller in state S2 as long as OVF=0 and PD=1, the output of flip-flop 441 is fed back through OR gate 432 to AND gate 433. The S2 output of flip-flop 441 determines the up/down mode of the up-down counter 42 by coupling it through an inverter 452 to an AND gate 446, which produces a U/D command pulse when enabled by a PD=1 output.

Flip-flop 442 produces a pulse S3 for defining the third sequence when the output of AND gate 435 is "1", which occurs if OVF=0 and PD=0 in the presence of S1=1 or S2=1. To maintain the sequence controller in state S3 as long as OVF=0 and PD=0, the output of flip-flop 442 is fed back through OR gate 434 to AND gate 435. The S3 output is further coupled via OR gate 436 to an AND gate 437 whose output is coupled to the data input of flip-flop 443.

Each of the S2 and S3 outputs is coupled through an OR gate 445 to an AND gate 447 to produce an enable pulse EN2 when AND gate 446 is enabled by the first timing pulse T1.

Flip-flop 443 produces a pulse S4 for defining the fourth sequence when the output of AND gate 437 is "1", which occurs if OVF=0 and PD=1 in the presence of S3=1. To maintain the sequence controller in state S4 as long as OVF=0 and PD=1, the output of flip-flop 443 is fed back through OR gate 436 to AND gate 437. The S4 output is applied to an AND gate 448 to produce an enable pulse EN1 when AND gate 448 is enabled by the first timing pulse T1, and is further applied to an AND gate 438 whose output is coupled through OR gate 439 to the data input of flip-flop 444.

Flip-flop 444 produces a pulse S5 for defining the fifth sequence when the output of AND gate 438 is "1", which occurs if OVF=0 and PD=0 in the presence of S4=1. To maintain the sequence controller in state S5 as long as OVF=0, the output of flip-flop 444 is fed back to an AND gate 453, which is enabled by the output of inverter 430 to drive the data input of flip-flop 444. The S5 output is applied to an AND gate 449 to produce an enable pulse EN0 when AND gate 449 is enabled by the first timing pulse T1.

The timing diagram of FIG. 8 shows in detail the operation of the sequence controller 41 during periods $t_1$ to $t_5$ along with the operation of the first timing counter 44 and flip-flop 45 by which the timing pulse ST and T1 are respectively produced. The operation of the sequence controller will be described by assuming that the overflow input OVF is "0" during a period from time $t_0$ to the 6th clock pulse of the fifth period $t_5$. It is further assumed that a phase detector PD=1 occurs in the first period $t_1$ and continues until the 6th clock of the second period $t_2$, producing a pulse PDa, and occurs again during a period between the 6th clock pulses of periods $t_3$ and $t_4$ (PDb), so that all sequences S1 to S5 appear in this order during periods $t_1$ to $t_5$. Timing pulses T1a to T1e are produced in response to the 6th reference clock pulse of the first to fifth periods, respectively, and start timing pulses STa to STe are produced immediately following the trailing edge of corresponding pulses T1a to T1e.

During the first period $t_1$, the sequence controller is initialized by a reset pulse RST, causing the logic level of the S1 output to switch to "1". Clock pulses from delay line 10 are allowed to propagate through the clock tree 20 and are compared with the reference clock, with the result that the phase detector 30 produces a PD=1 output, setting the U/D output to "1". During the second period $t_2$, the S2 output of flip-flop 441 is switched to "1" in response to the leading edge of start timing pulse STa because of the presence of PD=1 and S1=1. Using the feedback path, flip-flop 441 sail-maintains the S2 output in the "1" state. With S2=1, the up-down command U/D is switched to "0" and an enable pulse EN2a is produced in response to the timing pulse T1b. The S1 output is now switched to "0" in response to the pulse STa.

During the third period $t_3$, the S3 output of flip-flop 442 is switched to "1" in response to the leading edge of start timing pulse STb because of the presence of PD=0 and S2=1. Using the feedback path, flip-flop 442 self-maintains the S3 output in the "1" state. With S3=1, the PD input is switched to "1" again, and so an enable pulse EN2b is produced in response to the timing pulse T1c and the U/D command terminal is switched to "1" again. The S2 output is now switched to "0" in response to the pulse $ST_b$.

During the fourth period $t_4$, the S4 output of flip-flop 443 is switched to "1" in response to the leading edge of start timing pulse STc because of the presence of pulses PDb and S3=1. Using the feedback path, flip-flop 443 self-maintains the S4 output in the "1" state. With S4=1, an enable pulse EN1a is produced in response to the timing pulse T1d and the U/D command terminal is switched to "0" at the trailing edge of pulse PDb. The S3 output is now switched to "0" in response to the pulse STc.

During the fifth period $t_5$, the S5 output of flip-flop 444 is switched to "1" in response to the leading edge of start timing pulse STd because of the presence of PD=0 and S4=1. Using the feedback path through AND gate 453, flip-flop 444 self-maintains the S5 output in the "1" state. With S5=1, an enable pulse EN0a is produced in response to the timing pulse $T1_e$. The S4 output is now switched to "0" in response to the pulse STd.

During the sixth period $t_6$, the overflow input OVF is "1" and the S1 output of flip-flop 440 is switched to "1" again in response to the leading edge of the timing pulse STe. With OVF=1, the AND gate 453 output switches to "0", causing the S5 output of flip-flop 444 to return to "0".

Figure 9:
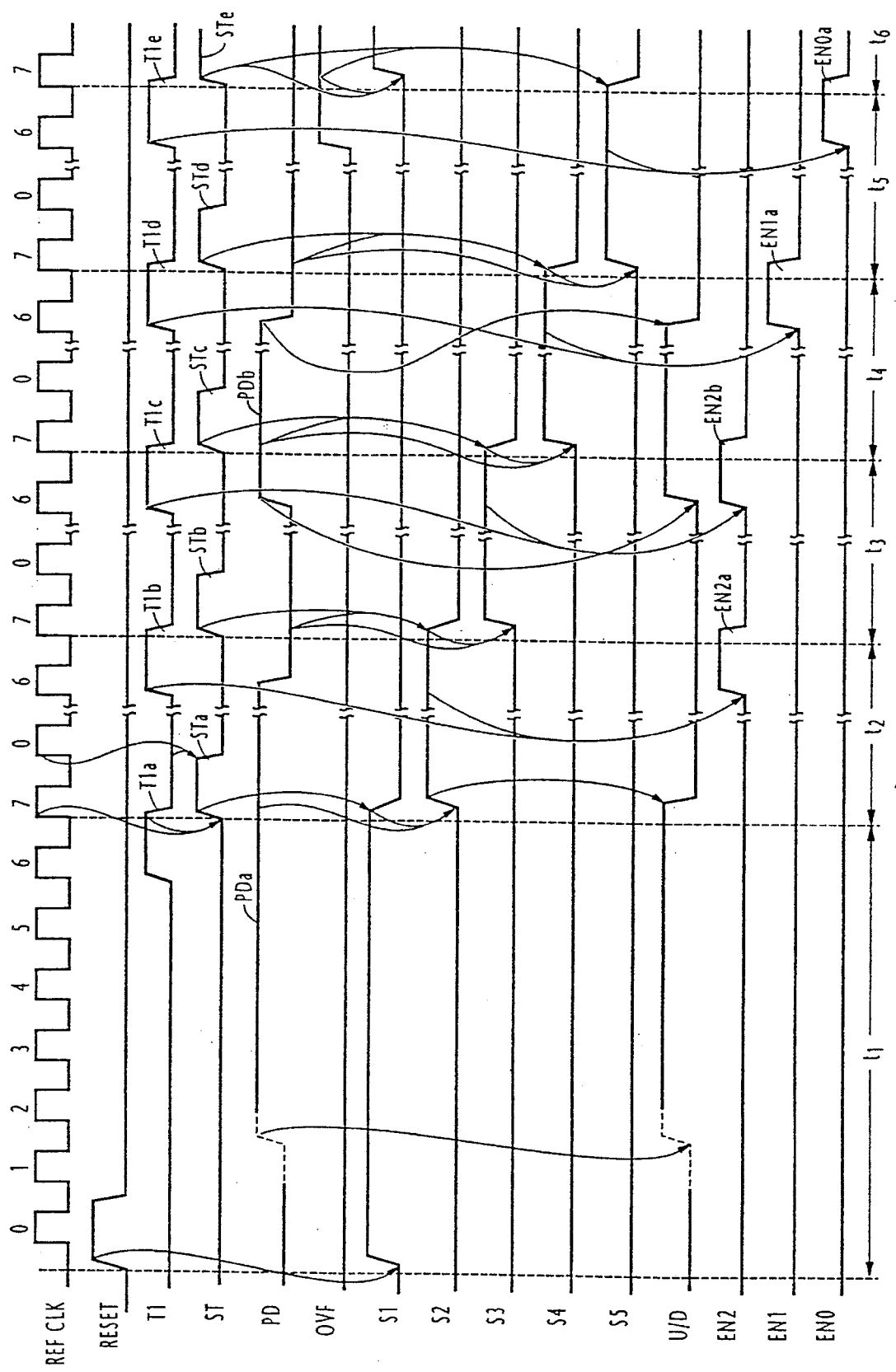
FIG. 9 is a timing diagram for describing the operation of the sequence controller.

It is seen from FIG. 9 that each of the enable pulses EN0, EN1 and EN3 has a duration corresponding to the interval between the leading edges of successive reference clock pulses. Due to the inherent delay of the sequence controller 41, the leading edge of each enable pulse lags slightly behind the leading edge of the corresponding reference clock pulse.

Figure 10:
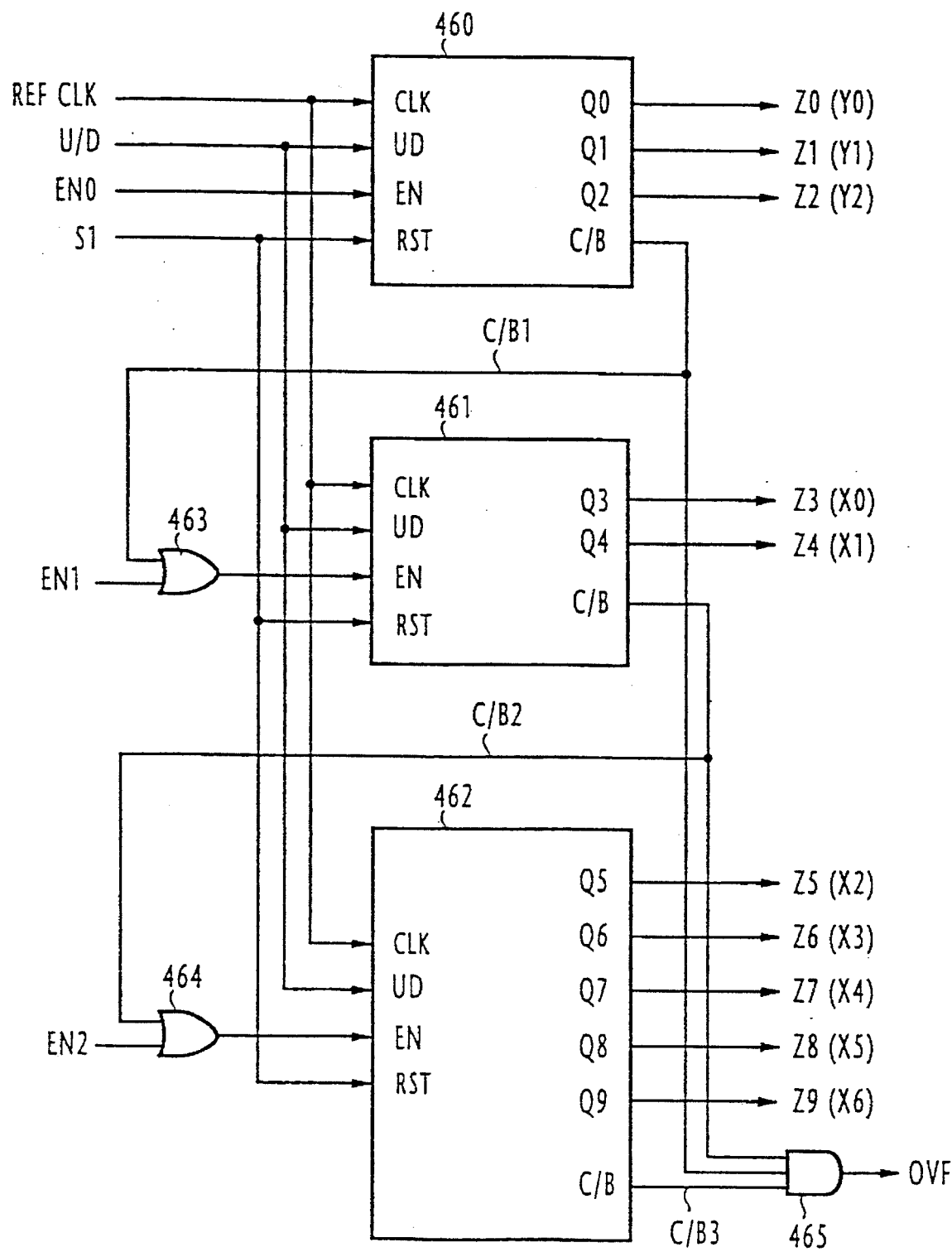
FIG. 10 is a block diagram illustrating details of the up-down counter of FIG. 3.

Referring to FIG. 10, the up-down counter 42 comprises counters 460, 461 and 462, and OR gates 463 and 464, and an AND gate 465. Each of the counters 460, 461 and 462 is reset when the sequence signal S1 is high and is enabled in the presence of an enable pulse to count a corresponding reference clock pulse to increment or decrement its count value depending on the logic level of the up-down command U/D to produce output pulses Z at the Q output terminals of each counter and a carry/borrow output C/B.

When U/D=0, each counter operates in a "count-down" mode, and when U/D=1, each counter operates in a "count-up" mode. With U/D=0, C/B=1 in each counter indicates that it is producing a borrow output and with U/D=1, C/B=1 indicates that it is producing a carry output. The logic state of the C/B output of each counter varies in response to the leading or trailing edge of the up-down command pulse U/D even if the counter is not enabled.

Figure 11A:
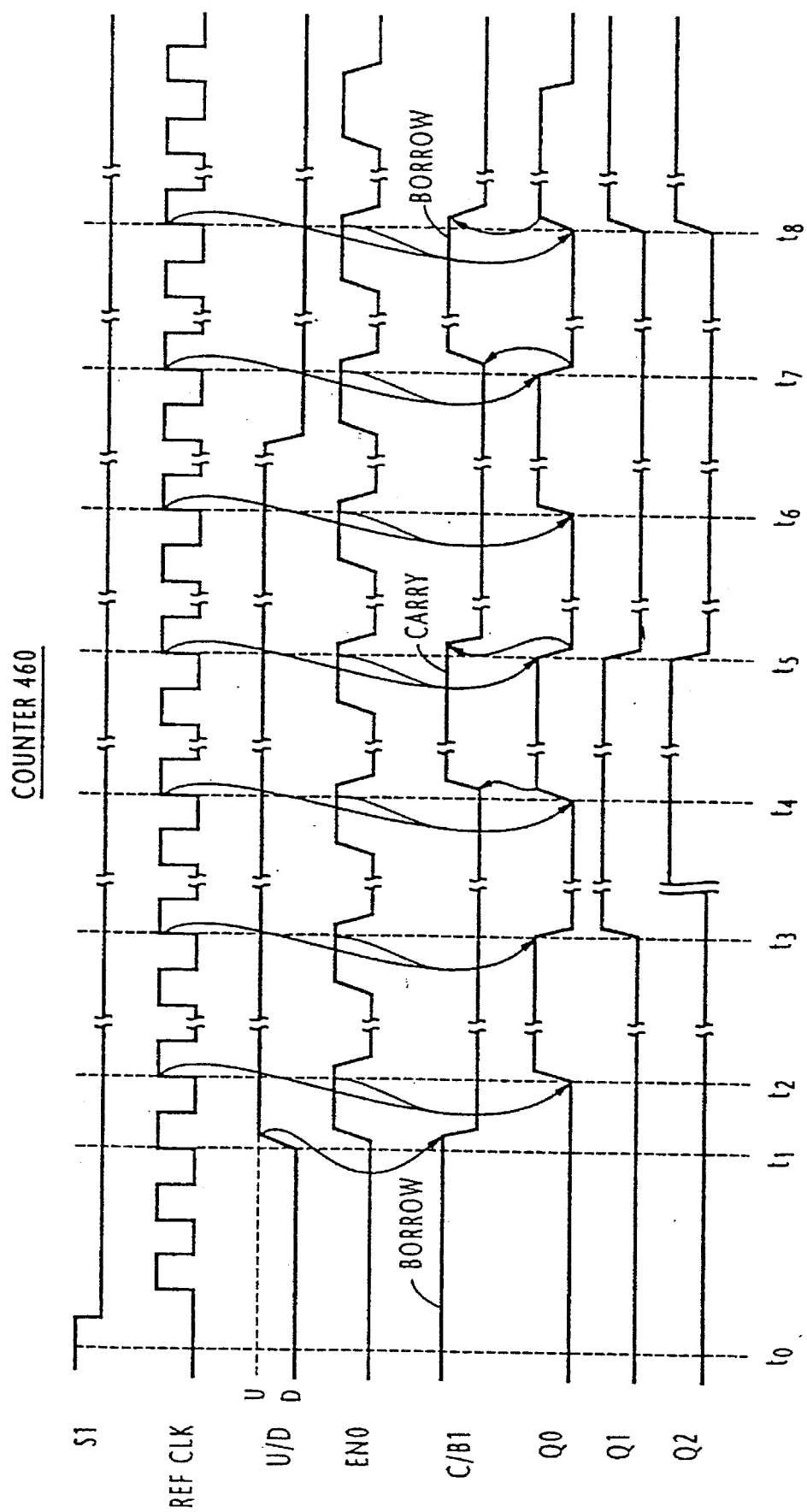
FIGS. 11A, 11B and 11C are timing diagrams associated with the internal counter circuits of the up-down counter.

The operations of counters 460, 461 and 462 will be described with reference to the timing diagrams of FIGS. 11A, 11B and 11C, respectively, by assuming that each counter is enabled at times $t_2$ to $t_8$. During each interval between successive times $t_2$ to $t_8$, a varying number of clock pulses exist depending on the occurrences of enable pulses. Each counter is incremented or decremented depending on the logic level of the U/D command at the leading edge of a reference clock pulse only when there is a corresponding enable pulse. It is further assumed that the up-down command U/D is "1" between times $t_2$ and $t_6$ in FIG. 11A, between times $t_2$ and $t_5'$ in FIG. 11B, and is "0" until at least time $t_6$ in FIG. 11C.

During the initial period of the operation of counter 460, (FIG. 11A), the up-down command U/D is "0" and the carry/borrow output C/B1 "1", indicating that a borrow output is produced between times $t_0$ and $t_1$ and all the Q outputs are zero.

At time $t_2$, the counter 460 is incremented to cause the Q0 output to go high ("1") and at time $t_3$ it is incremented, so that Q0 goes low ("0") and Q1 goes high. Similar events occur during the time following $t_3$ and Q0 is "0" and Q1 and Q2 are "1" immediately preceding time $t_4$. Therefore, at time $t_4$, the counter 460 is incremented to the full count value and Q0 goes high. Because of the presence of U/D=1, a carry output C/B 1=1 is produced.

At time $t_5$, the counter 460 is further incremented, causing Q0, Q1, Q3 to go low at the same time and the carry output C/B1 changes to "0". At time $t_6$, the counter 460 is incremented and Q0 changes to "1" which continues until time $t_7$, whereupon the counter 460 is decremented to "000" because of the presence of U/D=0. Since Q0, Q1 and Q3 are all "0"s, the C/B1 output changes to "1", producing a borrow output. In the presence of the borrow output at time $t_8$, the counter 460 is decremented so that its count value corresponds to the full count "111" and the C/B1 output goes low.

The outputs Q0, Q1 and Q2 of the counter 460 are supplied as delay control bits Z0, Z1 and Z2 to the latch 43 where they are latched and delivered to the delay line 12 as control bits Y0, Y1 and Y2.

Figure 11B:
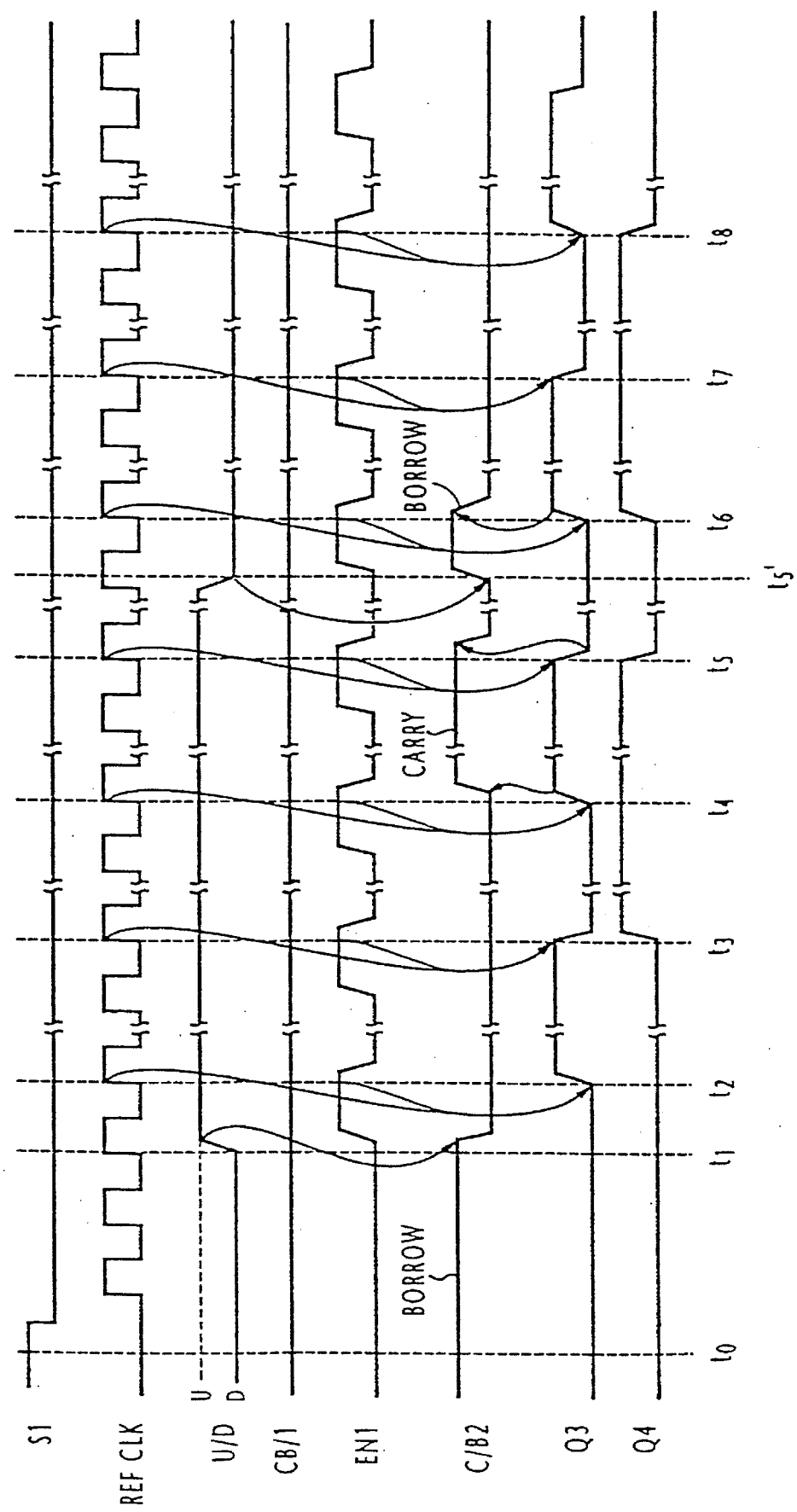

In FIG. 11B, the operation of counter 461 differs from that of counter 460 in that it is enabled in response to a 1 output from the carry/borrow output C/B1 of counter 460, as well as in response to the enable pulse EN1. Assuming that there is no C/B1=1 output, the counter 461 is enabled only in response to each enable pulse EN1. At time $t_2$, the counter 461 is incremented, producing a 1 at the Q3 output. At time $t_3$, the counter 461 is incremented further, causing Q3 to go low and Q4 to go high, which continues until time $t_4$, whereupon the counter 461 is incremented to change Q3 to "1 ", producing a full count, and hence, a carry output C/B2=1. At time $t_5$, the counter 461 is incremented, producing a count value "00" and causing the C/B2 output to go low. In response to the trailing edge of the up-down command U/D at time $t_5'$, the C/B2 output changes to "1", producing a borrow output. At time $t_6$, the counter 461 is decremented, producing a full count value "11". In the presence of U/D=0, the counter 461 is successively decremented to "10" and "01 " at times $t_7$ and $t_8$, respectively.

Figure 11C:
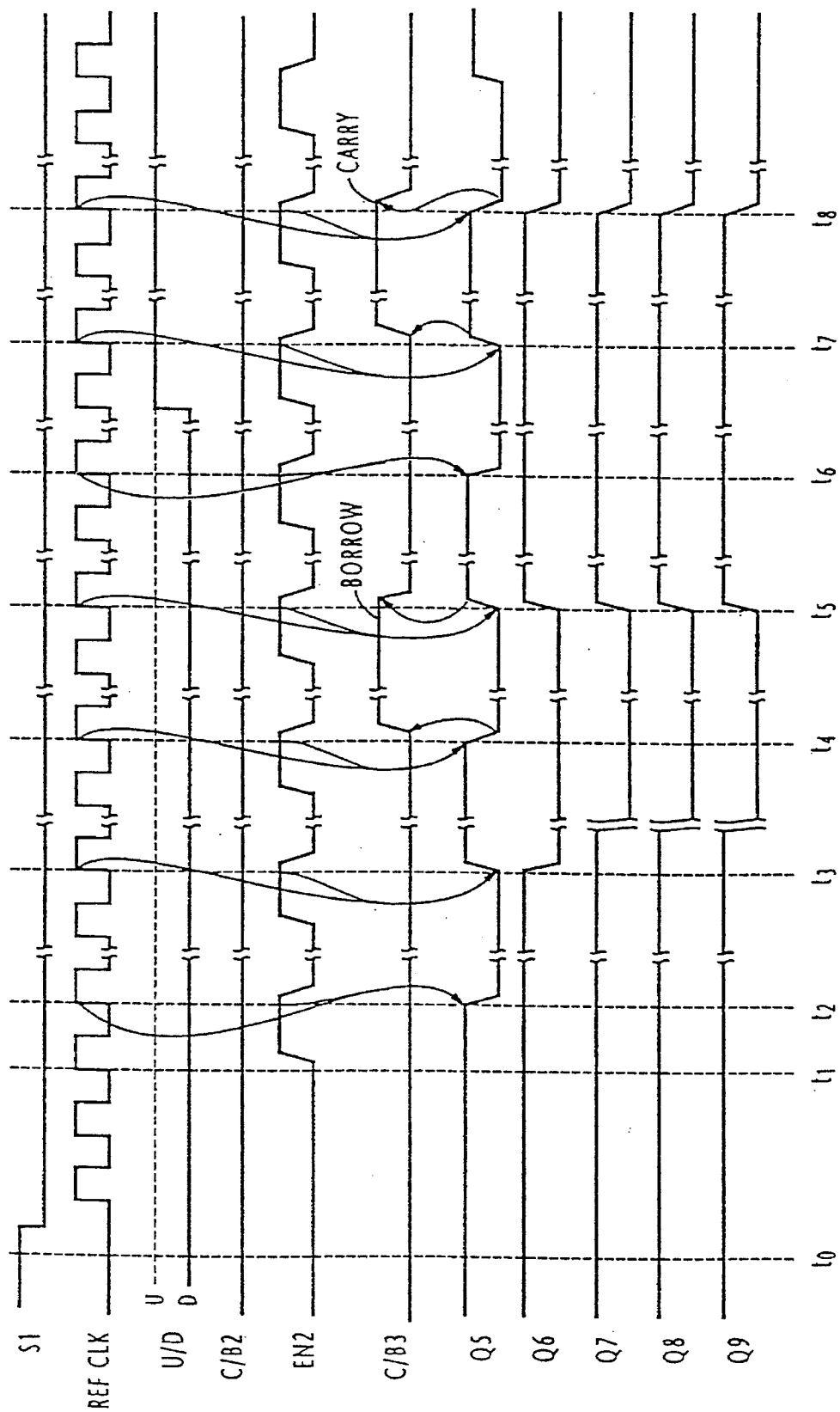

In FIG. 11C, the counter 462 is enabled in response to the C/B2=1 output of counter 461 as well as in response to the enable pulse EN2. Assuming that there is no C/B2=1 output, the counter 462 is enabled only in response to each enable pulse EN2. Because of the presence of U/D=0, the counter 462 is successively decremented from the full count value "11111" and reaches "00000" immediately following time $t_4$, producing a borrow output C/B3=1. With C/B3=1, the counter 462 is decremented, producing a full count "11111" at time $t_5$, causing the C/B3 output to change to "0". With the U/D input still being "0" at time $t_6$, the counter 462 is decremented to "11110". Since the U/D command has been changed to "1" before time $t_7$, the counter 462 is incremented to the full count at time $t_7$ and a carry output is produced. At time $t_8$, the counter 462 is incremented to a zero count value, causing the C/B3 output to change to "0".

The carry/borrow outputs C/B1, C/B2 and C/B3 of all counters are supplied to the AND gate 465 to supply the overflow pulse OVF to the sequence controller 41, as mentioned previously.

The Q0 to Q2 outputs of counter 460 constitute a 3-bit signal with Q0 and Q2 being the least and most significant bits, respectively. These three bits are supplied as Z0 to Z2 to the latch 43 where they are latched and supplied to the fine stepsize delay line 12 as control bits Y0 to Y2, so that the delay time introduced by delay line 12 is varied with increments of the unit delay time $D_2$. On the other hand, the Q3 and Q4 outputs of counter 461 and the Q5 to Q9 outputs of counter 462 constitute a 7-bit signal with Q3 being the least significant bit and Q9 being the most significant bit. These Q3 to Q9 outputs are stored in the latch 43 as Z3 to Z9 and supplied to the coarse stepsize delay line 11 as control bits X0 to X6, so that the delay time introduced by delay line 11 is varied with increments of the unit delay time $D_1$.

As described with reference to FIG. 7B, when the sequence controller 41 has been reset in the initial sequence S1, it operates in one of four sequences S2 to S5, starting with sequence S2 or S3 and thereafter moving to sequences S4 and S5 depending on the logic level of the phase detector output PD as illustrated in FIG. 8, and a corresponding one of enable pulses EN0, EN1 and EN2 is produced (see also FIG. 9), and supplied to counters 460, 461 and 462 (FIG. 10).

During sequences S2 and S3, the enable pulse EN2 is produced and counter 462 is operated, while counters 460 and 461 remain in the initialized state. Therefore, the fine stepsize delay line 12 is supplied with control bits "000" to introduce a minimum delay $D_2$ and the coarse stepsize delay line 11 is supplied with five higher bits X3 to X6 and two lower zero bits X0=X1 =0. Therefore, the amount of total delay introduced by variable delay line 10 is varied with a resolution which is four times the unit delay time $D_1$ during the sequences S2 and S3.

During sequence S4, the enable pulse EN1 is produced and counters 461 and 462 are operated as a single counter connected by the carry/borrow output C/B2, while counter 460 remains in the initialized state. Therefore, the fine stepsize delay line 12 is still supplied with all zero bits and the coarse stepsize delay line 11 is supplied with all seven bits X0 to X6. Therefore, the amount of total delay introduced by variable delay line 10 is varied with a resolution equal to the unit delay time $D_1$ during the sequence S4.

During sequence S5, the enable pulse EN0 is produced and all counters 460, 461, 462, connected by the carry/borrow outputs C/B1 and C/B2, operate as a single counter. Therefore, the fine stepsize delay line 12 is still supplied with the three control bits Y0 to Y2 and the coarse stepsize delay line 11 is supplied with all seven bits X0 to X6. Therefore, the amount of total delay introduced by variable delay line 10 is varied with a resolution equal to the unit delay time $D_2$ during the sequence S5.

It is seen therefore that the resolution of the variable delay line 10 increases stepwisely as the operating state of sequence controller 41 changes from sequence S2.

As it is seen from the foregoings the 3-bit counter 44 sets the phase comparison timing between the reference clock and the delayed clock. The use of this timing counter would seem to prolong the time to attain phase synchronization between these clock pulses. However, the stepwise decrements of the resolution of the up-down counter 42 under sequence controller 41 reduces the amount of time taken to acquire phase synchronization.

In order to permit the phase comparison to be made at the leading edge of the reference clock, the delay time $D_1 \times 4$ must be smaller than the minimum pulse duration of the reference clock pulse.

In quantitative terms, when the Q3 output of counter 461 is incremented or decremented in response to a change in the carry/borrow output C/B1 of counter 460 (i.e., Q3, Q2, Q1, Q0 change from "0111" to "1000" or vice versa), there is a change in the total delay time of $D_1 - D_2 \times N$, where N is the number of the delay elements of fine stepsize delay line 12, which is one less than the maximum count value of counter 460. In the illustrated embodiment, the total delay time variation during such bit transition is $D_1 - D_2 \times 7$. Since this amount of delay would cause a jitter if it exceeds $D_2$, the delay units $D_1$ and $D_2$ of both delay lines 11 and 12 are determined so that they have a relation $D_1 - D_2 \times N \leq D_2$, i.e., $D_1 < (N+1) D_2$ to prevent jitter from exceeding $D_2$. Therefore, the relation $N \times D_2 < D_1 \leq (N+1) D_2$ (i.e., $7 \times D_2 < D_1 \leq 8 \times D_2$) should be observed.

The PLL has a longest sync acquisition time if the unit delay time of each element of the coarse delay line 11 reduces because of manufacturing tolerances or ambient conditions and if there is a maximum phase difference in the PLL which corresponds to one reference clock interval. If $D_1$ is 0.18 nanoseconds, and the reference clock interval T is 20 NS, $8 \times T/(D_1 \times 4)$, i.e., 222 clock pulses (corresponding to 4440 nanoseconds) are needed to attain synchronization if the variable delay 10 is controlled with the maximum stepsize, i.e., $D_1 \times 4$, for such a maximum phase difference during sequences S2 and S3. Since 32 (=8×4) clock pulses are required to correct a phase difference corresponding to $D_1 \times 4$ with the minimum stepsize $D_2$, and 64 (=8×8) clock pulses are needed meet the requirement that $D_1$ be larger than $D_2 \times 7$ and equal to or smaller than $D_2 \times 8$ just described above, a maximum of 318 clock pulses (corresponding to 6360 nanoseconds) are required for sync acquisition when the variable delay line 10 is controlled with the minimum stepsize $D_2$ during sequence S5.

Figure 12:
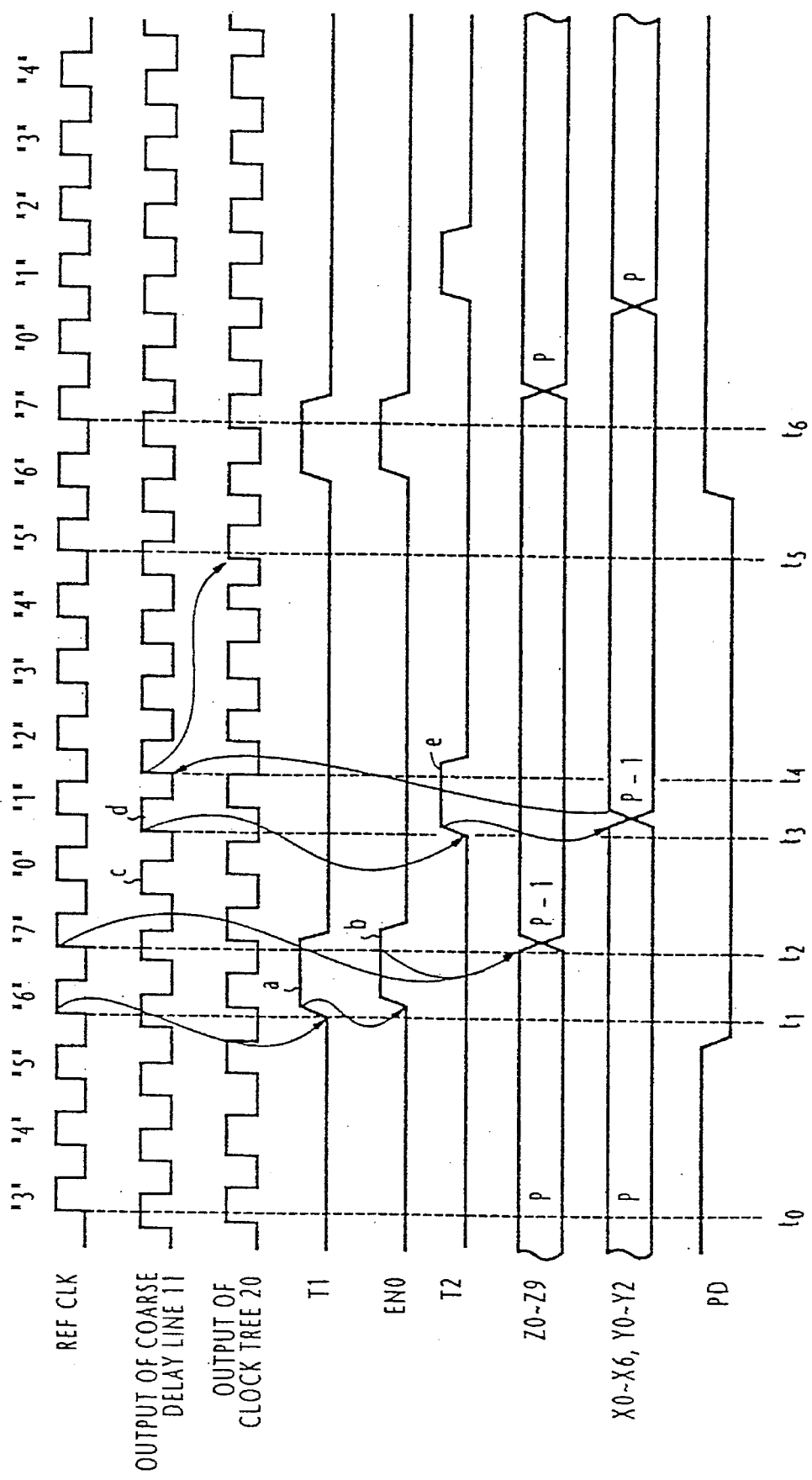
FIG. 12 is a timing diagram for describing a typical operation of the phase locked loop of this invention.

For a fuller understanding of the present invention, a typical operation of the digital phase-locked loop during sequence S5, for example, is illustrated in FIG. 12.

At time $t_0$, the Z0 to Z9 outputs of up-down counter 42 assume a value P. At time $t_1$, the first timing counter 44 produces a T1 timing pulse "a" in response to the leading edge of a 6th reference clock pulse, which causes the sequence controller 41 to produce an EN0 enable pulse "b". In the presence of the enable pulse "b", a 7th clock pulse produced at time $t_2$ causes the up-down counter 42 to decrement its outputs to P−1 since the phase detector output PD is "0". The second timing counter 46 counts output pulses "c" and "d" of the coarse stepsize delay line 11 and produces a T2 timing pulse "e" at time $t_3$ which causes the latch 43 to store and forward the P−1 value to the delay line 10 as X and Y outputs. A clock pulse from delay line 11 that appears at time $t_4$ following the update of X, Y values is further delayed by delay line 12 and propagates through the clock tree 20 and appears at the input of phase detector 30 at time $t_5$. In response to the next 7th clock pulse (time $t_6$), the up-down counter 42 updates its outputs depending on the PD output of phase detector 30 produced as a result of the phase comparison at time $t_5$. At time $t_6$, the phase detector 30 is producing a PD=1 output which causes the output Z of the up-down counter to be incremented to P.

Since the up-down counter 42 has no knowledge on the phase timing of the clock being delayed by the coarse stepsize delay line 11 and hence has no ability to determine when to deliver its outputs, the purpose of the second timing pulse T2 is to determine the correct timing for the up-down counter to forward its outputs by counting a predetermined number of pulses from the coarse stepsize delay line 11.

From the foregoing it is seen that, since phase comparison occurs once for a series of clock pulses, a sufficient amount of time margin can be assigned to the delay controller 40 in order to wait for the clock pulses returning from the clock tree 20.

If the transit time of the delayed clock pulses through the clock tree 20 is considerably shorter than the interval between successive count up/down operations (between times $t_2$ and $t_6$ in FIG. 12), the phase lock loop is timewise inefficient. In such cases, it is advantageous to reduce the amount of period between times $t_5$ and $t_6$.

Figure 13:
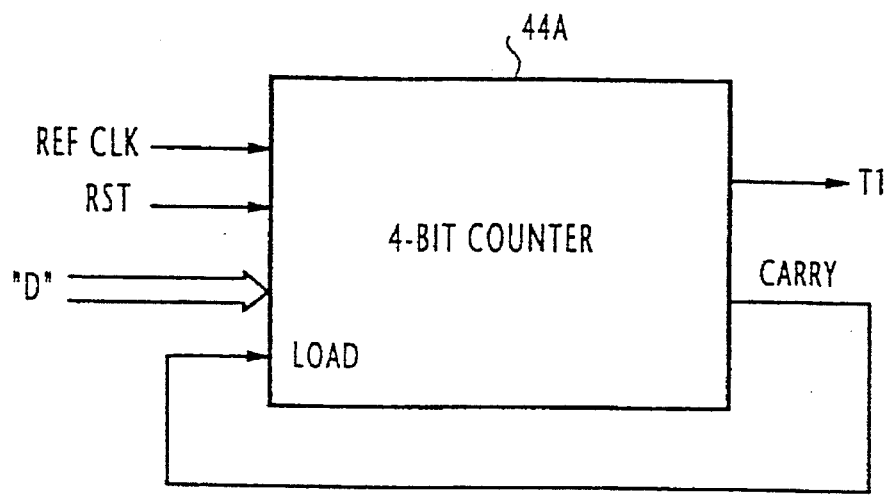
FIG. 13 is a block diagram of a modified timing counter.
Figure 14:
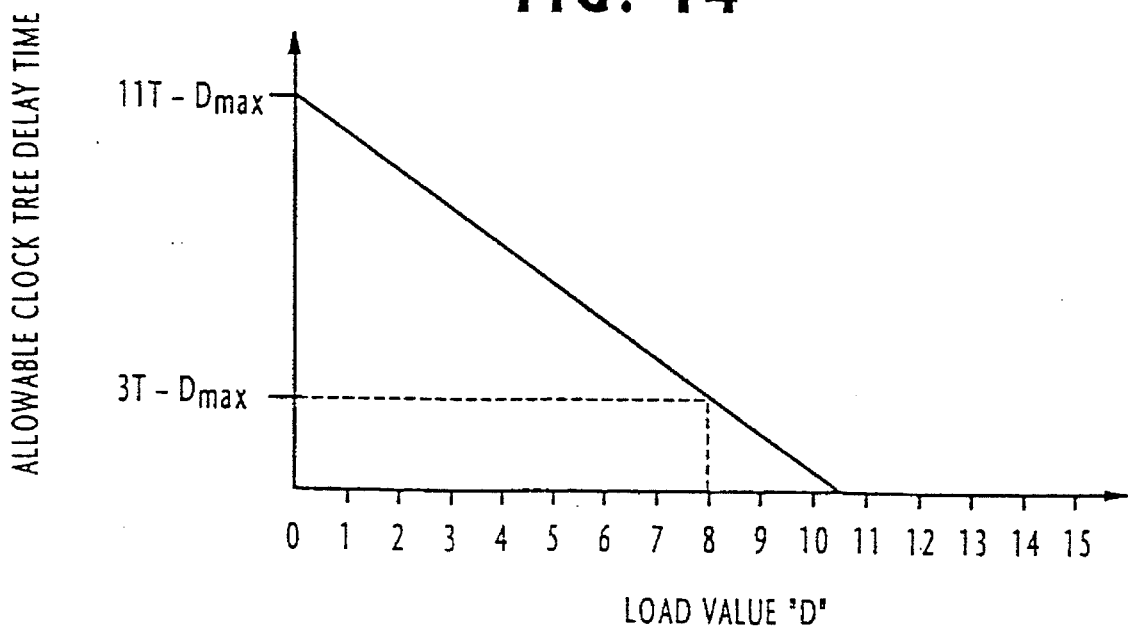
FIG. 14 is a graphic representation of the load value of the modified timing counter in relation to the allowable delay time of the clock tree of FIG. 3.

FIG. 13 illustrates a modified embodiment in which the 3-bit counter 44 of FIG. 3 is replaced with a 4-bit programmable counter 44A having a load input for loading a preselected count value D in response to a carry output produced by the counter 44A. Initially, the counter 44A operates as a hexadecimal counter to count reference clock pulses when it is initialized by a reset pulse. When a carry is output when the hexadecimal counter attains a full count value "16", the count value D is loaded and the full count value of the counter changes to 16−D. The count value D is determined in relation to the transit time of clock pulses that propagate through the clock tree 20 so that once the PLL operates following the initial state which prevails during the first 16 clock pulses, the period between successive up/down count operations can be reduced by an amount corresponding to the loaded value D, and hence, to the delay time of the clock tree 20. The use of the loading technique allows the PLL to operate with a minimum of waste by adapting the counter 44A to the delay time of the clock tree 20. FIG. 14 shows the load value "D" and the allowable delay time of the clock tree. Since three clock pulses are present during times $t_4$ and $t_5$, a load value D of decimal "8" corresponds to an allowable clock-tree delay time of $3T-D_{max}$ where, T is the reference clock interval and $D_{max}$ is the maximum total delay time of the fine stepsize delay line 12. If the load value is "0", the delay time allowed for the clock tree 20 is equal to $11 \times T - D_{max}$.

With this loading arrangement, the clock tree 20 has an extended range of allowable delay times and the sync acquisition time of the PLL can be optimized in accordance with the allowable delay time of the clock tree.

Figure 15:
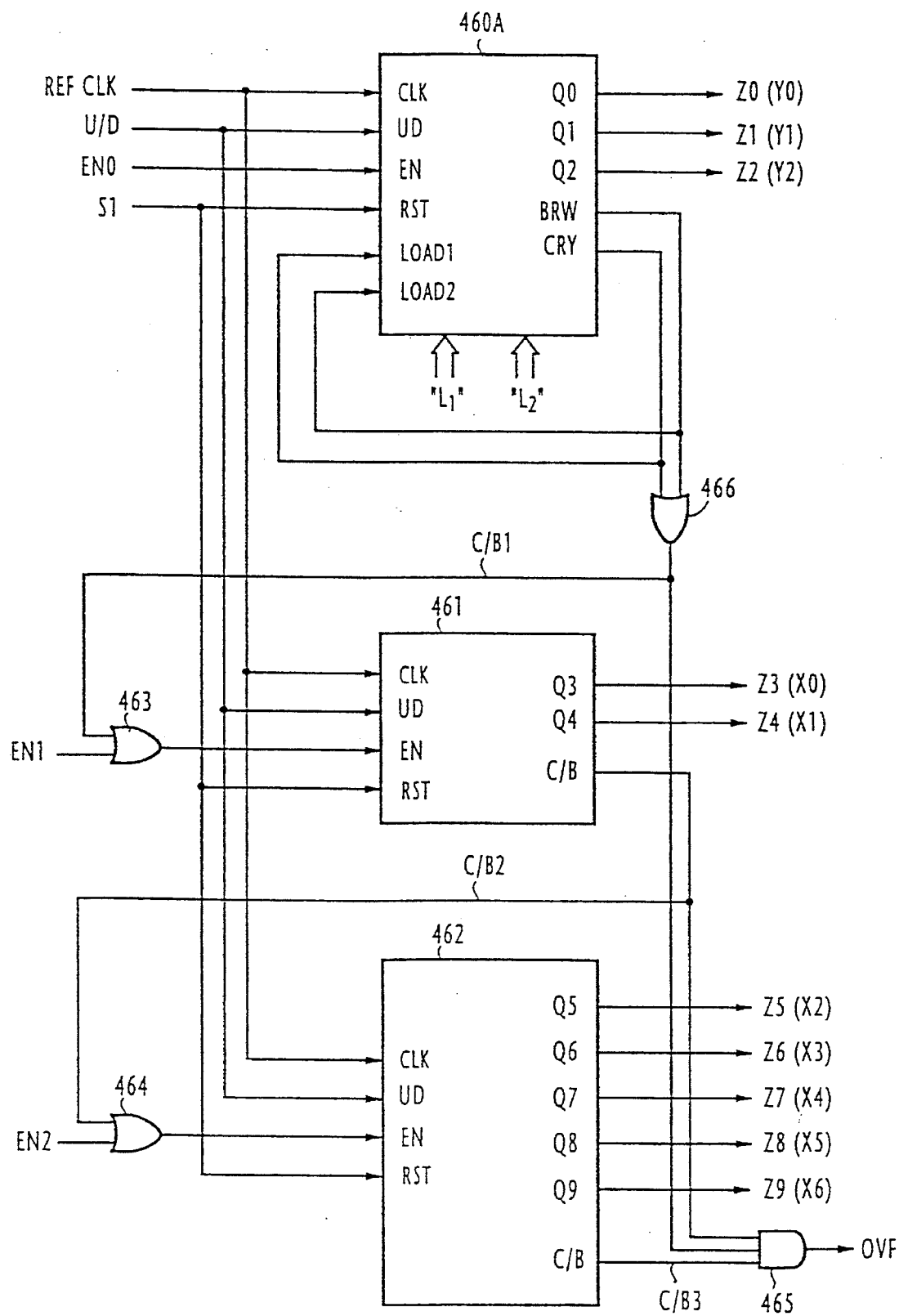
FIG. 15 is a block diagram of a modified up-down counter.

The up-down counter is modified as indicated at 42A in FIG. 15. The up-down counter 42A includes a counter 460A having a load input and a separate carry output and a separate borrow output which are combined by an OR gate 466 and supplied as carry/borrow output C/B1 to the OR gate 463 as in the previous embodiment. The carry and borrow outputs of counter 460 are fed back to the load inputs LOAD1 and LOAD2 of this counter to load three-bit counts "$L_1$" and "$L_2$", respectively, which are respectively "010" and "101", for example.

Figure 16:
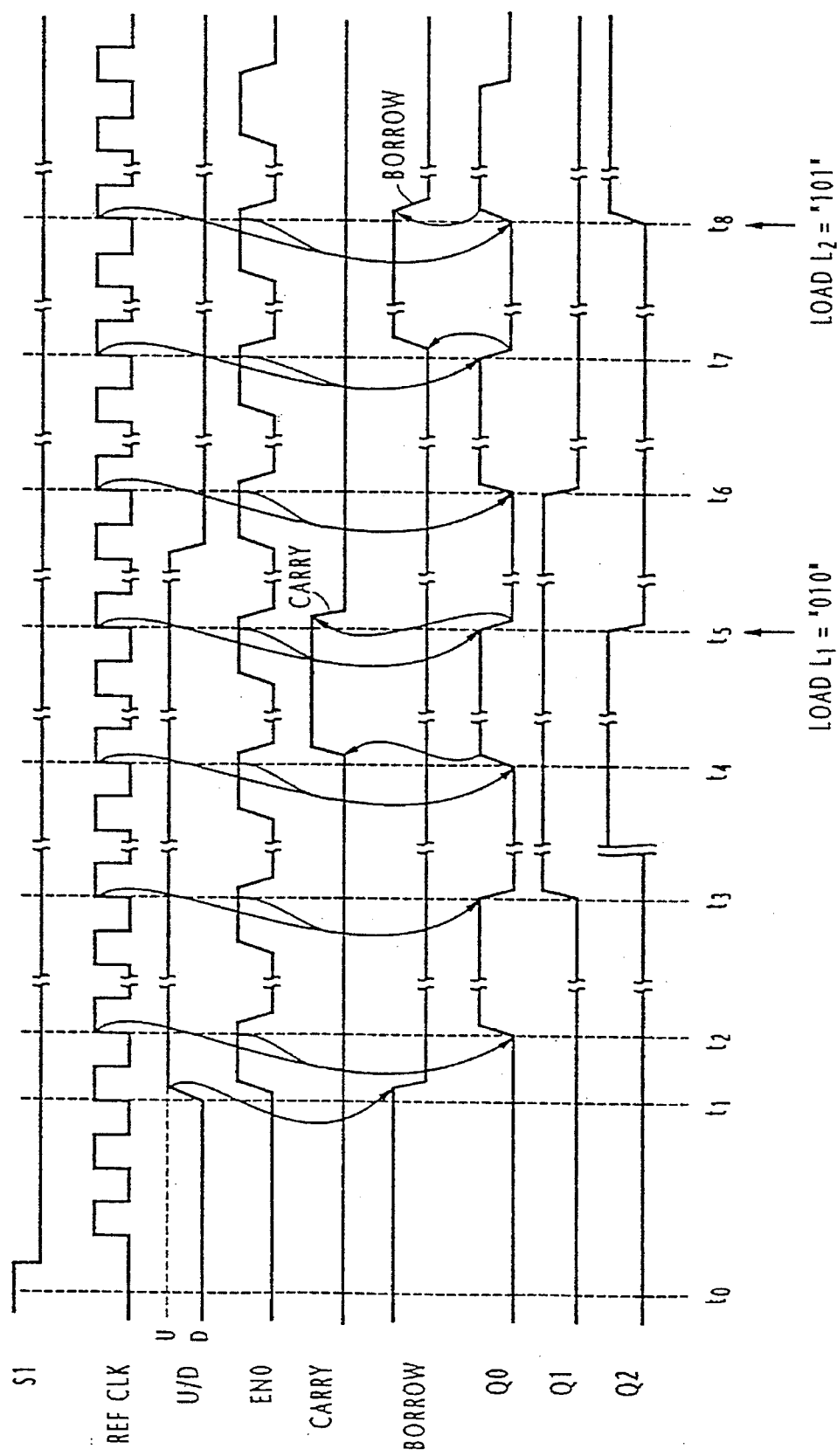
FIG. 16 is a timing diagram associated with an internal counter circuit of the modified up-down counter of FIG. 15.

When the counter 460A reaches a full count and produces a carry output at time $t_4$, causing the counter 461 to produce a Q3=1 output, the value "010" is loaded at the trailing edge of the carry output at time $t_5$ as illustrated in FIG. 16. Without this loading, the count value would change to "000". Thus, when a full count is reached the counter 460A starts incrementing from the loaded value "010", rather than from the otherwise all-zero count. The maximum count-up range of counter 460A now changes from the count of 8 to the count of 6.

When the counter 460A reaches a zero count and produces a borrow output at time $t_7$, causing the counter 461 to produce a Q3=1 output, the value "101" is loaded at the trailing edge of the borrow output at time $t_8$. Thus, when a zero count is reached the counter 460A starts decrementing from the loaded value "101", rather than from the otherwise all-one count.

Since the requirement to prevent jitter from exceeding $D_2$ is given by the relation $D_1 i \leq (N+1)D_2$, this requirement changes to $D_1 i < (N+1-L_1)D_2$ as a result of the loading of the value $L_1$ (where N is 7 in the illustrated embodiment). Thus, in the illustrated embodiment, the anti-jitter requirement changes from $D_1 i \leq 8 \times D_2$ to $D_1 i \leq 6 \times D_2$.

In response to the borrow output at time $t_8$, the counter 460 is loaded with the value $L_2$. The loading of this value causes the counter 460A to change from "000" to "101", i.e., from decimal "0" to "5", rather than to decimal "7". The maximum count-down range of the counter 460A also changes from the count of 8 to the count of 6 as in the case of the count-up mode. The requirement for the PLL that $D_1 i \leq (N+1)D_2$ now changes to requirement $D_1 i \leq (L_2+1) D_2$, i.e., from $D_1 i \leq 8 \times D_2$ to $D_1 i \leq 6 \times D_2$.

Since the $D_1$ value can be determined from the lowest frequency of the lock range of the PLL and $D_2$ from the jitter performance, the loading values $L_1$ and $L_2$ can be appropriately determined from the $D_1$ and $D_2$ values. Therefore, the PLL of this invention can be designed without serious concern about the relationships between $D_1$ and $D_2$.

What is claimed is:

1. A digital phase locked loop for use with a clock tree having an input and a plurality of clock propagation paths extending from the input to a plurality of outputs, comprising:

a coarse stepsize variable delay line and a fine stepsize variable delay line connected in series for receiving a reference clock pulse and imparting thereto variable delays in accordance with higher significant bits applied to the coarse stepsize delay line and in accordance with lower significant bits applied to the fine stepsize delay line, and delivering the delayed clock pulse to the input of said clock tree;

a phase detector for detecting a phase difference between the reference clock pulse and delayed clock pulse appearing at one of the outputs of the clock tree; and delay control means for counting the reference clock pulse to produce a count value, incrementing or decrementing the count value in accordance with an output of said phase detector and supplying the count value as said higher and lower significant bits to said coarse and fine stepsize variable delay lines at longer intervals than intervals at which said reference clock pulse occurs so that said delayed clock pulse is allowed a sufficient time to propagate through said clock tree, said delay control means including:

a first time counter for counting said reference clock pulse to produce a count and producing a first timing pulse when the count repeatedly reaches a predetermined value, said first timing pulse defining the start timing of each of said longer intervals;

a sequence controller responsive to a first occurrence of said first timing pulse for producing a first enable pulse when the output of said phase detector has a first logic level, and responsive to a repeated occurrence of said first timing pulse for producing a second enable pulse when the output of said phase detector has changed to a second logic level;

an up-down counter arranged to be enabled in response to said first and second enable pulses for counting the reference clock pulse to produce a count value, incrementing or decrementing the count value in accordance with a phase comparison provided by said phase detector, and producing from the count value a first group of delay control bits in response to said first enable pulse, and a second group of delay control bits and a third group of delay control bits in response to said second enable pulse;

a second timing counter responsive to each occurrence of said first timing pulse for counting a delayed clock pulse from said coarse stepsize delay line to produce a count, and producing a second timing pulse when the count reaches a predetermined value, said second timing pulse defining the end timing of each of said longer intervals; and a latch, responsive to said second timing pulse, for latching and forwarding the first and second groups of delay control bits to said coarse stepsize delay line as said higher significant bits and latching and forwarding the third group of control bits to said fine stepsize delay line as said lower significant bits.

2. A digital phase locked loop for use with a clock tree having an input and a plurality of clock propagation paths extending from the input to a plurality of outputs, comprising:

a coarse stepsize variable delay line and a fine stepsize variable delay line connected in series for receiving a reference clock pulse and imparting thereto variable delays in accordance with higher significant bits applied to the coarse stepsize delay line and in accordance with lower significant bits applied to the fine stepsize delay line, and delivering the delayed clock pulse to the input of said clock tree;

a phase detector for detecting a phase difference between the reference clock pulse and delayed clock pulse appearing at one of the outputs of the clock tree; and delay control means for counting the reference clock pulse to produce a count value, incrementing or decrementing the count value in accordance with an output of said phase detector and supplying the count value as said higher and lower significant bits to said coarse and fine stepsize variable delay lines at longer intervals than intervals at which said reference clock pulse occurs so that said delayed clock pulse is allowed a sufficient time to propagate through said clock tree, said delay control means including:

a first timing counter for counting said reference clock pulse to produce a count and producing a first timing pulse when the count repeatedly reaches a predetermined value, said first timing pulse defining the start timing of each of said longer intervals;

a sequence controller responsive to a first occurrence of said first timing pulse for producing a first enable pulse when the output of said phase detector has a first logic level or a second logic level, responsive to a repeated occurrence of said first timing pulse for producing a second enable pulse when the output of said phase detector has changed from said first or second logic level to the second or first level, respectively, and responsive to a further repeated occurrence of said first timing pulse for producing a third enable pulse when the output of said phase detector has changed from the logic level at which said second enable pulse was produced;

an up-down counter arranged to enable in response to said first, second and third enable pulses for counting the reference clock pulse to produce a count value, incrementing or decrementing the count value in accordance with a phase comparison provided by said phase detector, and producing from the count value a first group of delay control bits in response to said first enable pulse, a second group of delay control bits in response to said second enable pulse and a third group of delay control bits and a fourth group of delay control bits in response to said third enable pulse;

a second timing counter responsive to each occurrence of said first timing pulse for counting a delayed clock pulse from said coarse stepsize delay line to produce a count, and producing a second timing pulse when the count reaches a predetermined value, said second timing pulse defining the end timing of each of said longer intervals; and a latch, responsive to said second timing pulse, for latching and forwarding a first, second and third groups of delay control bits to said coarse stepsize delay line as said higher significant bits and latching and forwarding the fourth group of control bits to said fine stepsize delay line as said lower significant bits.

3. A digital phase locked loop as claimed in claim 1, wherein said up-down counter includes means for producing an overflow output for resetting said sequence controller to an initialized state when the count value of the up-down counter reaches a full count.

4. A digital phase locked loop as claimed in claim 3, wherein said sequence controller includes means responsive to said overflow output for causing said up-down counter To be initialized to a reset state for a period sufficients for the delayed clock pulse to propagate through said clock tree and starting to produce said enable pulses at the end of said period.

5. A digital phase locked loop as claimed in claim 3, wherein said first timing counter is arranged to be loaded with a second full count value when a first full count is reached after said sequence controller is reset to said initialized state, said first timing counter subsequently producing said first timing pulse when said load second full count is reached, said second full count value being smaller than said first full count value.

6. A digital phase locked loop as claimed in claim 2, wherein said up-down counter includes means for producing an overflow output for resetting said sequence controller to an intialized state when the count value of the up-down counter reaches a full count.

7. A digit phase locked loop as claimed in claim 6, wherein said sequence controller includes means responsive to said overflow output for causing said up-down counter to be initialized to a reset state for a period sufficient for the delayed clock pulse to propagate through said clock tree and starting to produce said enable pulses at the end of said period.

8. A digital phase locked loop as claimed in claim 7, wherein said first timing count is arranged to be loaded with a second full count value when a first full count is reached after said sequence controller is reset to said initialized state, said first timing counter subsequently producing said first timing pulse when said loaded second full count is reached, said second full count value being smaller than said first full count value.

9. A digital phase locked loop as claimed in claim 1, wherein said up-down counter includes:

a first internal counter for counting the reference dock pulse to produce a first count value, incrementing or decrementing the first count value in accordance with said phase comparison, and producing from the first count value said third group of delay control bits, said first internal counter being arranged to be loaded with a first value when the first internal counter produces a carry output and a second value when the first internal counter produced a borrow output; and a second internal counter for counting the reference clock pulse to produce a second count value, incrementing or decrementing the second count value in accordance with said phase comparison, and producing from the second count value said first and second groups of delay control bits in response to one of said carry and borrow outputs.

10. A digital phase locked loop as claimed in claim 2, wherein said up-down counter includes:

a first internal counter for counting the reference clock pulse to produce a first count value, incrementing or decrementing the first count value in accordance with said phase comparison, and producing from the first count value said fourth group of delay control bits, said first internal counter being arranged to be loaded with a first value when the first internal counter produces a carry output and a second value when the first internal counter produces a borrow output;

a second internal counter for counting the reference clock pulse to produce a second count value, incrementing or decrementing the second count value in accordance with said phase comparison, and producing from the second count value a lower significant subgroup of said second and third group, of delay control bits in response to each one of said carry and borrow outputs of internal counter; and a third internal counter for counting the reference clock pulse to product a third count value, incrementing or decrementing the third count value in accordance with said phase comparison, and producing from the third count value said first group of delay control bits and a higher significant subgroup of said third group of delay control bits in response to a carry or a borrow output produced by said second internal counter.

11. A digital phase locked loop for use with a clock tree having an input and a plurality of clock propagation paths extending from the input to a plurality of outputs, comprising:

a coarse stepsize variable delay line and a fine stepsize variable delay line connected in series for receiving a reference clock pulse and imparting thereto variable delays in accordance with higher significant bits applied to the coarse stepsize delay line and in accordance with lower significant bits applied to the fine stepsize delay line, and delivering the delayed clock pulse to the input of said clock tree;

a phase detector for detecting a phase difference between the reference clock pulse and delayed clock pulse appearing at one of the outputs of the clock tree; and delay controller to count the reference clock pulse to produce a count value, incrementing or decrementing the count value in accordance with an output of said phase detector and supplying the count value as said higher and lower significant bits to said coarse and fine stepsize variable delay lines at longer intervals than intervals at which said reference clock pulse occurs so that said delayed clock pulse is allowed a sufficient time to propagate through said clock tree, said delay controller including:

a first time counter for counting said reference clock pulse to produce a count and producing a first timing pulse when the count repeatedly reaches a predetermined value, said first timing pulse defining the start timing of each of said longer intervals;

a sequence controller responsive to a first occurrence of said first timing pulse for producing a first enable pulse when the output of said phase detector has a first logic level, and responsive to a repeated occurrence of said first timing pulse for producing a second enable pulse when the output of said phase detector has changed to a second logic level;

an up-down counter arranged to be enabled in response to said first and second enable pulses for counting the reference clock pulse to produce a count value, incrementing or decrementing the count value in accordance with a phase comparison provided by said phase detector, and producing from the count value a first group of delay control bits in response to said first enable pulse, and a second group of delay control bits and a third group of delay control bits in response to said second enable pulse;

a second timing counter responsive to each occurrence of said first timing pulse for counting a delayed clock pulse from said coarse stepsize delay line to produce a count, and producing a second timing pulse when the count reaches a predetermined value, said second timing pulse defining the end timing of each of said longer intervals; and a latch, responsive to said second timing pulse, for latching and forwarding the first and second groups of delay control bits to said coarse stepsize delay line as said higher significant bits and latching and forwarding the third group of control bits to said fine stepsize delay line as said lower significant bits.

12. A digital phase locked loop for use with a clock tree having an input and a plurality of clock propagation paths extending from the input to a plurality of outputs, comprising:

a coarse stepsize variable delay line and a fine stepsize variable delay line connected in series for receiving a reference clock pulse and imparting thereto variable delays in accordance with higher significant bits applied to the coarse stepsize delay line and in accordance with lower significant bits applied to the fine stepsize delay line, and delivering the delayed clock pulse to the input of said clock tree;

a phase detector for detecting a phase difference between the reference clock pulse and delayed clock pulse appearing at one of the outputs of the clock tree; and delay controller for counting the reference clock pulse to produce a count value, incrementing or decrementing the count value in accordance with an output of said phase detector and supplying the count value as said higher and lower significant bits to said coarse and fine stepsize variable delay lines at longer intervals than intervals at which said reference clock pulse occurs so that said delayed clock pulse is allowed a sufficient time to propagate through said clock tree, said delay controller including:

a first timing counter for counting said reference clock pulse to produce a count and producing a first timing pulse when the count repeatedly reaches a predetermined value, said first timing pulse defining the start timing of each of said longer intervals;

a sequence controller responsive to a first occurrence of said first timing pulse for producing a first enable pulse when the output of said phase detector has a first logic level or a second logic level, responsive to a repeated occurrence of said first timing pulse for producing a second enable pulse when the output of said phase detector has changed from said first or second logic level to the second or first level, respectively, and responsive to a further repeated occurrence of said first timing pulse for producing a third enable pulse when the output of said phase detector has changed from the logic level at which said second enable pulse was produced;

an up-down counter arranged to enable in response to said first, second and third enable-pulses for counting the reference clock pulse to produce a count value, incrementing or decrementing the count value in accordance with a phase comparison provided by said phase detector, and producing from the count value a first group of delay control bits in response to said first enable pulse, a second group of delay control bits in response to said second enable pulse and a third group of delay control bits and a fourth group of delay control bits in response to said third enable pulse;

a second timing counter responsive to each occurrence of said first timing pulse for counting a delayed clock pulse from said coarse stepsize delay line to produce a count, and producing a second timing pulse when the count reaches a predetermined value, said second timing pulse defining the end timing of each of said longer intervals; and a latch, responsive to said second timing pulse, for latching and forwarding a first, second and third groups of delay control bits to said coarse stepsize delay line as said higher significant bits and latching and forwarding the fourth group of control bits to said fine stepsize delay line as said lower significant bits.

* * * * *